United States Patent
Mukherjee

(10) Patent No.: US 11,763,526 B2
(45) Date of Patent: Sep. 19, 2023

(54) MULTIZONE QUADRILATERAL MESH GENERATOR FOR HIGH MESH QUALITY AND ISOTROPY

(71) Applicant: Siemens Industry Software Inc., Plano, TX (US)

(72) Inventor: Nilanjan Mukherjee, Cincinnati, OH (US)

(73) Assignee: Siemens Industry Software Inc., Plano, TX (US)

(*) Notice: Subject to any disclaimer, the term of this patent is extended or adjusted under 35 U.S.C. 154(b) by 0 days.

(21) Appl. No.: 17/270,185

(22) PCT Filed: Sep. 21, 2018

(86) PCT No.: PCT/US2018/052109
§ 371 (c)(1),
(2) Date: Feb. 22, 2021

(87) PCT Pub. No.: WO2020/060561
PCT Pub. Date: Mar. 26, 2020

(65) Prior Publication Data
US 2021/0327139 A1    Oct. 21, 2021

(51) Int. Cl.
*G06T 17/20* (2006.01)
*G06F 30/23* (2020.01)
(Continued)

(52) U.S. Cl.
CPC ............ *G06T 17/205* (2013.01); *G06F 30/23* (2020.01); *G06T 5/002* (2013.01); *G06T 17/10* (2013.01)

(58) Field of Classification Search
None
See application file for complete search history.

(56) References Cited

U.S. PATENT DOCUMENTS 7,671,858 B1    3/2010    Staten et al.
8,970,590 B1 *  3/2015    Brennan ................. G06T 17/20
                                                    345/581
(Continued)

FOREIGN PATENT DOCUMENTS

WO    WO2017040006 A1    3/2017

OTHER PUBLICATIONS

Moghimi, M.A. et al., "A Novel Computational Approach to Combine the Optical and Thermal Modelling of Linear Fresnel Collectors Using the Finite Volume Method", Solar Energy, Pergamon Press, Oxford, GB., vol. 116, May 20, 2015, pp. 407-427.

(Continued)

*Primary Examiner* — Nurun Flora

(57) ABSTRACT

Methods for CAD operations and corresponding systems (2100) and computer-readable mediums (2126) are disclosed herein. A method (2000) includes receiving model data (2002) of a surface (210) of a part (200) to be manufactured. The method includes performing a loop-paving process (2004) for a first portion of the surface (210) to produce a first set of elements (302, 304, 306). The method includes performing a Cartesian meshing process (2010) for a second portion of the surface (210) to produce a second set of elements (704). The method includes performing a subdivision meshing process (2016) for a third portion of the surface (210) to produce a third set of elements (1002). The method includes combining (2020) the first set of elements (302, 304, 306), the second set of elements (704), and the third set of elements (1002) to produce a final mesh (1202) for the surface (210) of the part (200) to be manufactured.

20 Claims, 21 Drawing Sheets

(51) Int. Cl.
 G06T 5/00 (2006.01)
 G06T 17/10 (2006.01)

(56) References Cited

U.S. PATENT DOCUMENTS

| | | | |
|---|---|---|---|
| 9,082,220 | B2 | 7/2015 | Mukherjee |
| 9,824,493 | B1* | 11/2017 | Chen ................ G06T 17/205 |
| 2013/0297267 | A1* | 11/2013 | Liang ................ G06F 30/20 |
| | | | 703/2 |
| 2017/0061037 | A1 | 3/2017 | Makem et al. |

OTHER PUBLICATIONS

Ward, Alan et al., "An Iterative Method for the Creation of Structured Hexahedral Meshes Over Complex Orography" Applied Methematics and Computation, vol. 218, No. 7, Dec. 31, 2011, pp. 3847-3855, DOI:10.1016/J.AMC.s011.08.111 [retrieved on Sep. 20, 2011].

Sahin, M. et al., "A Parallel Adaptive Unstructured Finite Volume Method for Linear Stability (normal mode) Analysis of Viscoelastic Fluid Flows", Journal of Non-Newtonian Fluid Mechanics, Elsevier, NL, vol. 155, No. 1-2, Nov. 1, 2008, pp. 1-14, DOI:10.1016/J.JNNFM.2008.01.004 [retrieved on Jan. 31, 2008].

PCT International Search Report and Written Opinion of International Searching Authority dated May 23, 2019 corresponding to PCT International Application No. PCT/US2018/052109 filed Sep. 21, 2018.

Zienkiewicz, O.C. et al., "An automatic mesh generation scheme for plane and curved surfaces by 'isoparametric' co-ordinates", Int. Journal Num. Meth. Engg., 1971, pp. 519-528, vol. 3, (4).

Sluiter, M.L. et al., "A General Purpose Automatic Mesh Generator for Shell and Solid Finite Elements", ASME Computers in Engg., 1982, pp. 29-34.

Yerry, N.P. et al., "A modified quadtree approach to finite element mesh generation", IEEE Comp. Graps and Appls. 3(1), 1983, pp. 39-46.

Blacker, Ted D. et al., "Paving: A New Approach to Automated Quadrilateral Mesh Generation", Int. Journal Num. Meth. Engg., 1991, pp. 811-847, vol. 32, John Wiley & Sons, Ltd.

Schneiders, R., "Automatic Generation of Hexahedral Finite Element Meshes", Proc. 4th Int. Meshing Roundtable, Oct. 1995, pp. 130-114, Albuquerque, NM.

Bern, Marshall et al., "Quadrilateral Meshing by Circle Packing", Int. J. Comput. Geom. Appl., 2000, pp. 347-360, vol. 10.

Owen, S.J. et al, "Q-MORPH : An Indirect Approach to Advancing Front Quad Meshing", Int. J. Numer. Meth. Engng. 44, 1999, pp. 1317-1340, John Wiley & Sons, Ltd.

Mukherjee, Nilanjan, "CSALF-Q: A Bricolage Algorithm for Anisotropic Quad Mesh Generation", Proc. XXth International Meshing Roundtable, 2011, pp. 489-510, Springer, Paris, France.

Cabello, Jean, "Toward Quality Surface Meshing", Proc. XIIth International Meshing Roundtable, 2003, pp. 201-213, Santa Fe, New Mexico.

* cited by examiner

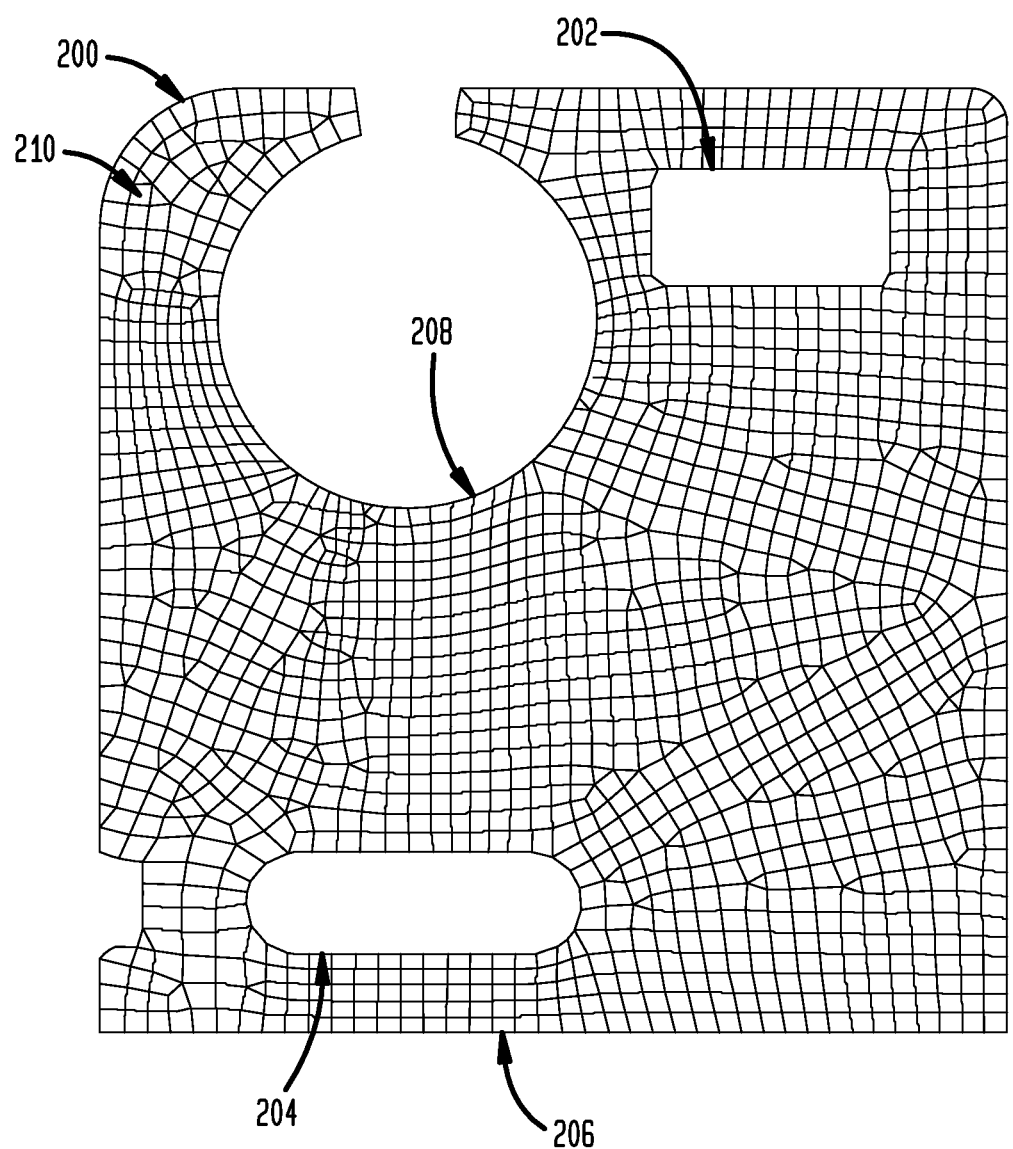

MULTIZONE QUADRILATERAL MESH GENERATOR FOR HIGH MESH QUALITY AND ISOTROPY

TECHNICAL FIELD

The present disclosure is directed, in general, to computer-aided design, visualization, engineering, and manufacturing systems ("CAD systems"), product lifecycle management ("PLM") systems, and similar systems, that manage data for products and other items (collectively, "Product Data Management" systems or PDM systems).

BACKGROUND OF THE DISCLOSURE

CAD systems are useful for designing and visualizing two-dimensional (2D) and three-dimensional (3D) models and drawings for manufacture as physical products. Improved systems are desirable.

SUMMARY OF THE DISCLOSURE

Various disclosed embodiments include a method for CAD operations and corresponding systems and computer-readable mediums are disclosed herein. A method includes receiving model data of a surface of a part to be manufactured. The method includes performing a loop-paving process for a first portion of the surface to produce a first set of elements. The method includes performing a Cartesian meshing process for a second portion of the surface to produce a second set of elements. The method includes performing a subdivision meshing process for a third portion of the surface to produce a third set of elements. The method includes combining the first set of elements, the second set of elements, and the third set of elements to produce a final mesh for the surface of the part to be manufactured.

Various disclosed embodiments also include a data processing system including a processor. The data processing system also includes an accessible memory. The data processing system is particularly configured to perform processes as described herein.

Various disclosed embodiments further include a non-transitory computer-readable medium encoded with executable instructions that, when executed, cause one or more data processing systems to perform processes as described herein.

Some embodiments also include manufacturing the part according to the final mesh. Some embodiments also include defining boundary nodeloops for the surface according to the first set of elements, joining the boundary nodeloops to produce a first single nodeloop, and constructs a bounding box according to the first single nodeloop. In some embodiments, the Cartesian meshing process is performed according to a bounding box that is constructed based on the first set of elements. Some embodiments also include defining zone nodeloops for the surface according to the first set of elements and the second set of elements, and joining the zone nodeloops to produce a single zone nodeloop. In some embodiments, the subdivision meshing process is performed according to a single connected zone nodeloop that is based on the first set of elements and the second set of elements. Some embodiments also include performing a smoothing process on a combination of the second set of elements and the third set of elements. Some embodiments also include transforming a bounding box of the surface to a different 2D or 3D coordinate domain.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying, designing, or analyzing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 2 illustrates a multiblocked mesh on the surface of a part to be manufactured, in accordance with disclosed embodiments;

DETAILED DESCRIPTION

Figure 1A:
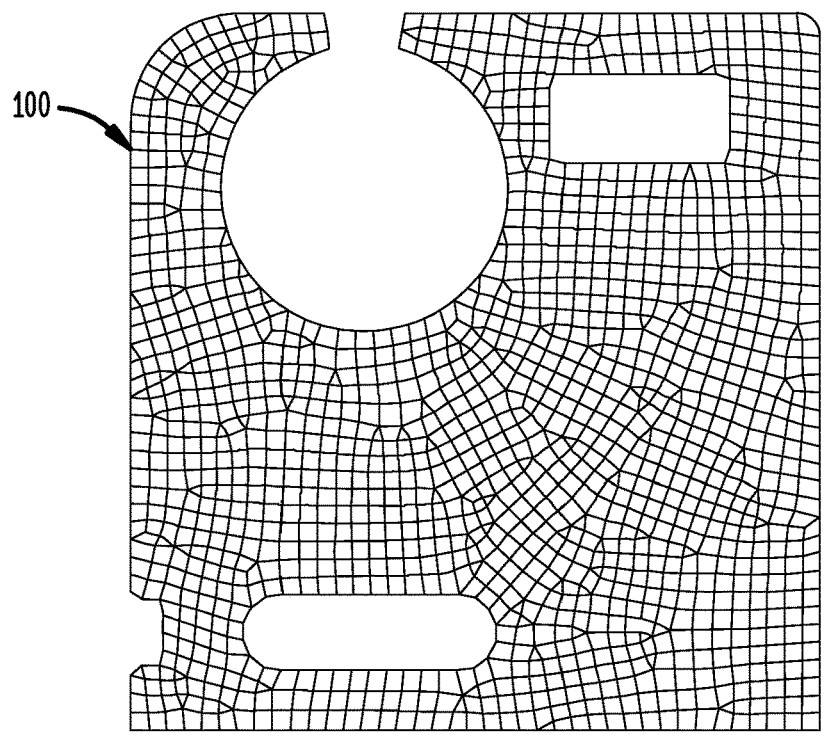
FIG. 1A illustrates an example of a subdivision quad-dominant mesh on a surface.

FIGS. 1 through 21, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

CAD systems are used to design, model, visualize, engineer, and eventually manufacture parts for manufacture. For modeling and analyzing parts, in particular, finite element analysis (FEA) techniques are used to create, analyze, manipulate, and simulate the surfaces, representative meshes, features, interactions, and behavioral characteristics of the parts. In a large number of industrial finite element analysis problems, in automotive and aerospace industries in particular, structural designers and analysts are in the need for quadrilateral-dominant meshes with very high fidelity and mesh quality. Many component areas in the automotive industry, like fillets, beads, annuli, flanges, and on large flat car-body panel areas in the neighborhood of these features are of special interest, especially for crash simulation. High-quality quad meshes can be valuable for computer-aided engineering design and analysis.

The accuracy of the many finite element analyses required, especially crash and multiphysics analyses, depends on the quality of the mesh solved. Quadrilateral meshes are typically used in these applications. In contrast to triangles (linear) which are planar, quadrilateral elements or quads, which are generally non-planar, are susceptible to error accumulation. Triangle meshes can be unsuitable for modeling many parts to be manufactured, such as sheet body parts, because triangular meshes tend to overstiffen the structure, leading to faulty design. A common deficiency of even the most well established surface meshing algorithms is the occurrence of poorly shaped, distorted quadrilaterals. Defects such as these are undesirable as they can significantly affect the accuracy of the finite element solution. Defects can also reduce computational efficiency of the solution process.

Disclosed embodiments include a surface mesh generator that can meet quad element quality requirement and strictly honor mesh size, such as described below.

Mesh quality requirements are an important factor in FEA processes. Quad element quality is measured by multiple different parameters, including Jacobian or other distortion metric, aspect ratio, skew, taper, warp, element included angles, minimum and maximum element edge lengths, etc. A quad element must be below a certain threshold for each one of these parameters. These parameters loosely related but no well-defined mathematical correlation exists between them.

All quad/quad-dominant mesh generation algorithms have limitations or natural flaws that lead to geometrically-deformed elements. Limitations or defects at different stages of the meshing process such as boundary discretization, surface flattening, paving, domain subdivision, or others may lead to the formation of a poorly shaped quad elements. While element-quality-driven mesh post-processing tools can address most defects, these solutions are expensive, cause size variation of anisotropy in the meshes, and cannot fix all defects.

Mesh isotropy requirements are also an important factor in FEA processes. Uniform mesh size or isotropic meshes, especially in non-feature, flat areas of surfaces is a major requirement. However, very often for a pre-defined element size which is normally specified by the user, there are scenarios where the actual mesh size deviates greatly from this target size. This leads to elements which are too small or too large. Smaller elements impact solver convergence rate where as a coarser mesh affect the solution accuracy. Mesh size variation also makes it harder for a quad element to pass the quality thresholds specified. In certain key areas of interest, like in automotive car-body panel flanges, beads, holes, annuli, dimples, and areas around these features a very well structured, layered mesh is important for improved solution accuracy.

FIG. 1A illustrates an example of a subdivision quad-dominant mesh 100 on a surface. Note that this example is "quad-dominant" in that it is primarily comprised of quad elements, but also includes some triangles.

Figure 1B:
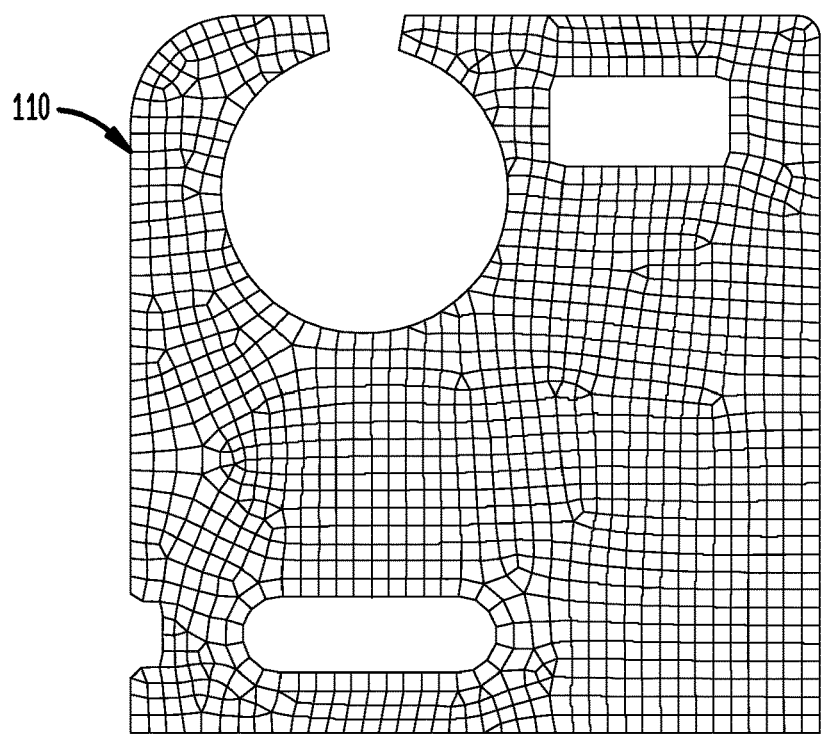
FIG. 1B illustrates an example of a quad-dominant paved mesh on a surface.

FIG. 1B illustrates an example of a quad-dominant paved mesh 110 on a surface. The paver method (or "paving") is an attractive quad mesh generation approach that can create very high quality structured meshes near surface boundaries. Surface boundaries are where features occur and critical components align. Stress and displacements are critically studied in these areas. Therefore, any mesher that creates high fidelity, high quality meshes in these zones become a first choice. A major shortcoming of paving is its loss of elegance in the deep interior of the surface where, due to wedging, tucking and seaming, the mesher fails to maintain mesh size isotropy and creates diamond-shaped quads interrupting a flow of nicely shaped mesh lines.

A subdivision mesher also encompasses transfinite meshing, and helps the mesher to create the most perfect quad meshes on 3 or 4-sided mesh areas.

Other quad mesh generation techniques like Cartesian or block-decomposition methods, circle-packing, etc., have been reported but they all suffer from severe limitations and have not found adaptors in the industry.

Known meshers have areas of strength but none of them have the flexibility to satisfy, in their entirety, quad meshing needs for industries and applications that require high quad element quality and that strictly honor mesh size, such as but not limited to automotive and aerospace industries. Disclosed embodiments include a quad mesher that can create structured mapped-like meshes of a finer size on surface features but uniform yet boundary structured meshes on the larger flatter faces in the neighborhood of features, while at the same time ensuring that the final quad meshes meet or exceed mesh quality thresholds.

Hybrid approaches include a transfinite or mapped mesher, a subdivision mesher, and loop-paver mesher. These meshers possess distinct strengths. For example, for regular 4-sided rectangular surfaces, transfinite meshing produces high-quality results, a loop-paver mesher performs well with boundary structured meshes, and the subdivision meshing algorithm has the efficiency and robustness to operate on narrow zones and severe constraints which can add high fidelity and mileage to a quad mesher. The Cartesian or block-decomposition methods have the unique ability to create perfectly shaped quad elements in the interior of any surface which is a desirable property especially for handling large faces with great width.

Disclosed embodiments include a Cartesian-Paver hybrid mesh process that overcomes weaknesses in other mesher techniques and provides a distinct improvement in the functionality and operation of the systems and devices employing disclosed processes.

A disclosed mesher is a hybrid approach that combines the multiple meshing strategies in a unique and innovative manner. Disclosed embodiments can use an improvised loop-paver algorithm on the surface boundaries to produce structured meshes upto two layers. Disclosed embodiments can use a Cartesian meshing approach for the major portion of the surface interior. Disclosed embodiments can use a subdivision meshing strategy to fill the narrow crack between the boundary structured paved zone and the Cartesian inner zone. Finally, disclosed embodiments can use a transfinite (or mapped) meshing process with a subdivision mesher where regularly-structured quadrilateral meshes are generated if the surface or its sub-areas are rectangular.

FIG. 2 illustrates a surface 210 of a part 200 to be manufactured, meshed with a subdivision mesher used along with a multiblock strategy described in United States Patent Publication US20170061037A1, hereby incorporated by reference. Topologically, this face of part 200 has two inner loops (at openings 202 and 204) bounded by a concave outer loop (outer boundary 206, including in concave portion 208 of the outer loop). FIG. 2 shows a multiblocked subdivision mesh (as opposed to multizoned) on the surface of part 200.

The loop-paver (also known as "Combined Subdivision And Loop-Front-Quad" or "CSALF-Q") is an improvised loop-front based paving process which advances a row of quad elements created on an input loop. The output of the algorithm is a row of good shaped quad elements and another loop, which is formed by the outer edges of the row of elements (which may be referred to herein as "second loops"). A deficiency or limitation of the loop-paver is that the paved loop is completely discarded if it self-intersects or intersects with other face-loops. This is a deliberate limitation of the typical loop-paver process, in that it allows the loop-paver process to interact fully with a subdivision mesher. Discarding a paved loop in its entirety because of an intersection found with a few of its fronts is often an advantage as the resultant domain is split again so as to result in more "payable" boundaries.

According to disclosed embodiments, the system performs a modified loop-paving process for a first zone (Zone 1).

However, discarding the paved loop is not preferred in a Cartesian-paver mesher as disclosed herein. Disclosed embodiments create just one or two layers on the boundary so as to create a boundary-structured mesh and not make any more inroads into the surface. The inner core is handled by the Cartesian algorithm. Therefore, the disclosed loop-paver process is modified to avoid dropping complete layers when an intersection is found. Instead, only the intersecting elements are erased.

Figure 3:
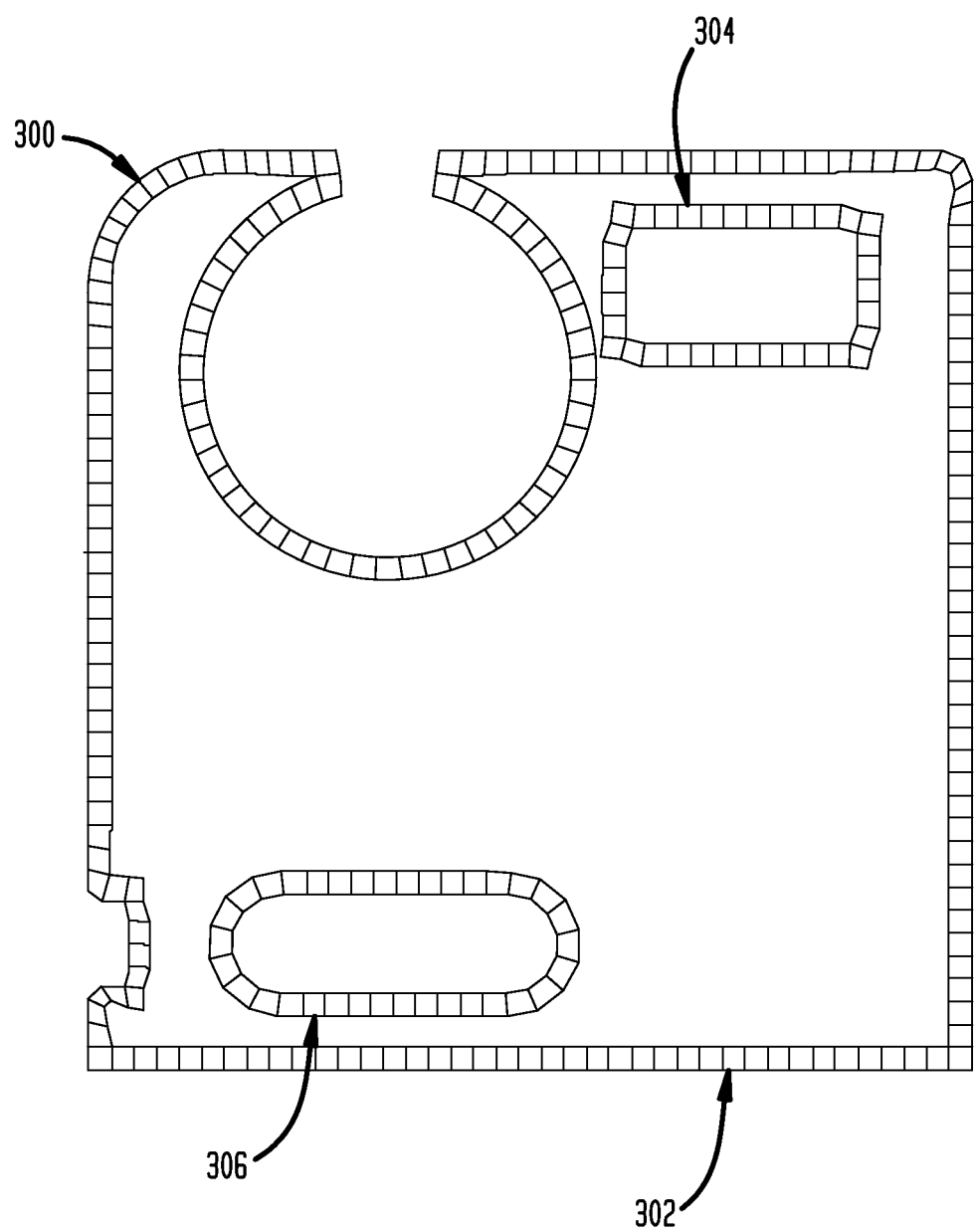
FIG. 3 illustrates a model with one layer of loop-paved elements around all face-loops in accordance with disclosed embodiments.

FIG. 3 illustrates a model 300 with one layer of loop-paved elements around all face-loops in accordance with disclosed embodiments. This figure shows outer loop boundary elements 302 and inner loop boundary elements 304 and 306. These paved row(s) of elements form meshing Zone 1 as referred to herein.

Assume the paver method creates m quad elements and $q_P$ nodes. Then, the Paver mesh P can be expressed as $$P = \cup (m, q_P) \quad (1.1)$$

In this particular example, no elements were dropped from the first paved layers because no loop-loop intersection was found. The second layer however, could not be created as too many elements intersected for all three loops. Partial loop-paving is only performed when new loop intersection is minimal.

Figure 4:
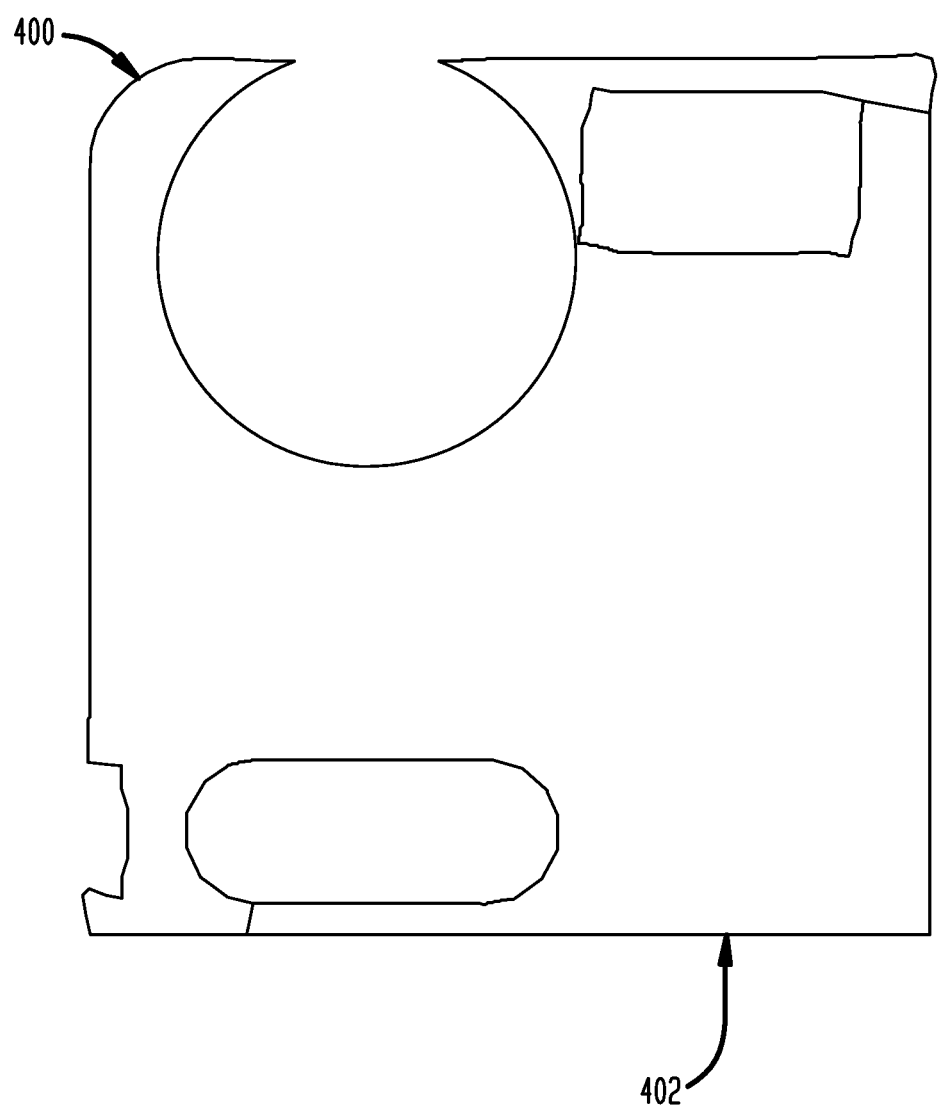
FIG. 4 illustrates boundary nodeloops joined into a single connected loop in accordance with disclosed embodiments.

According to disclosed embodiments, the system performs a Cartesian meshing process in a second zone (Zone 2). FIG. 4 depicts a model 400 with the boundary nodeloops 402 of the paved layers (illustrated with lines). These lines define the inner and outer boundaries of Zone 2—the area on which the system will perform a Cartesian meshing process for most or all of the bounded area. A traditional loop joining process is used to join the three loops into a single loop with some retraceable section. Such a loop-joining process is known to those of skill in the art.

In FIG. 4, "Zone 2" nodeloops 402 in model 400 formed from the paved layers joined into a single loop with retraceable sections, in accordance with disclosed embodiments.

The system then constructs a bounding box of the resultant single loop. The bounding box of the domain is expressed as $$B = \exists N(x,y) | 0 \leq x \leq a, 0 \leq y \leq b \quad (1.2)$$

where $N(x,y)$ denotes the coordinates of the 2D nodeloop. Note that while specific examples may refer to 2D or 3D elements herein, the techniques and processes described herein can be applied to either 2D or 3D parts, surfaces, elements, etc.

Next, the system generates a Cartesian mesh on the bounding box. A Cartesian mesh C is similar to a voxel mesh and can be expressed as an assembly of n elements and $q_C$ nodes as $$C = \cup (n, q_C) \quad (1.3)$$

Figure 5:
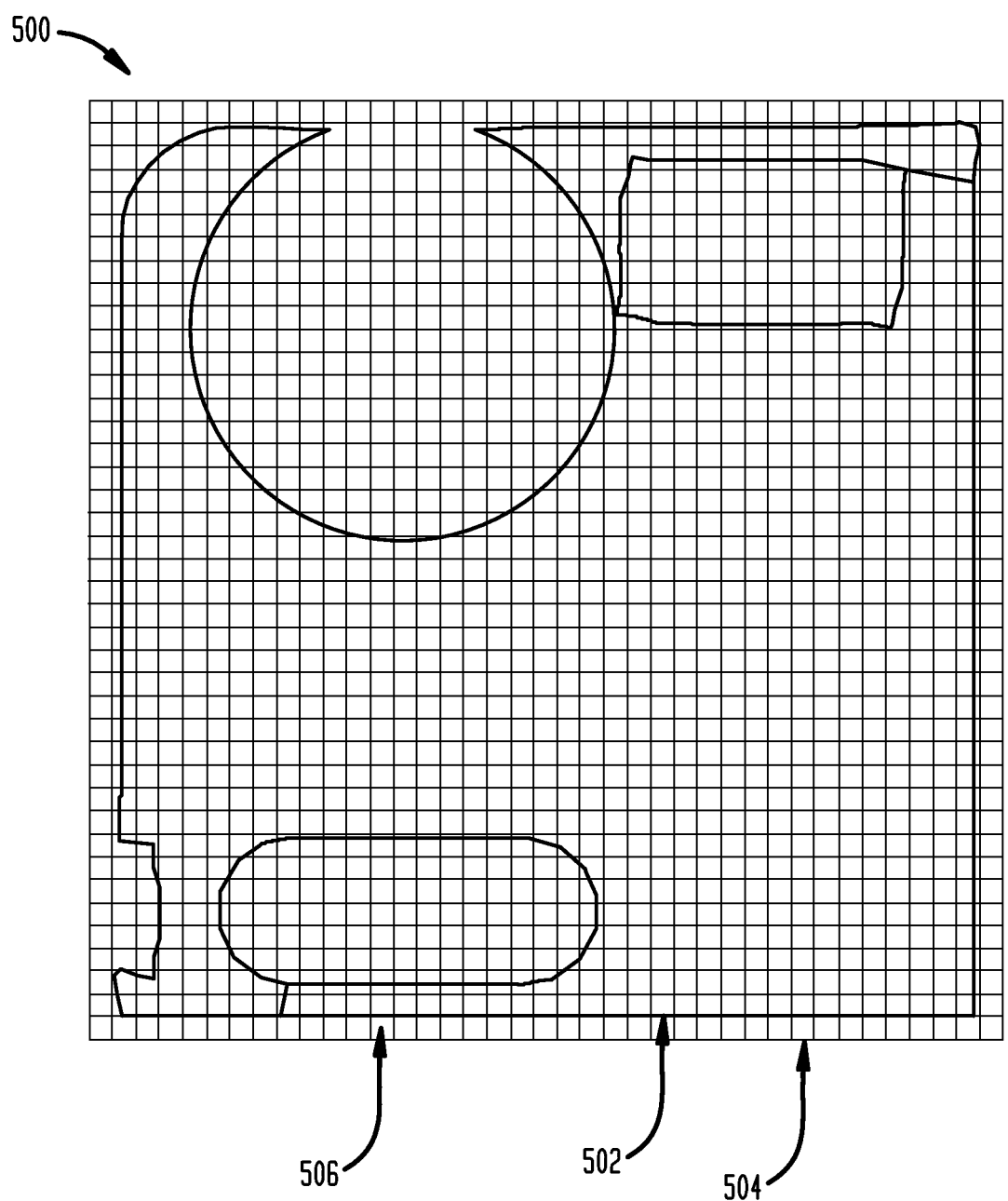
FIG. 5 illustrates a Cartesian mesh in accordance with disclosed embodiments.

FIG. 5 illustrates a Cartesian mesh 504 on the bounding box 506 of the resultant single loop 502 in model 500, in accordance with disclosed embodiments.

The number of n elements generated is carefully computed so as to reflect the user-driven size at which the face needs to be meshed. Every element of the Cartesian mesh is a perfect square. The coordinates of the m nodes in terms of the extremums (a,b) of the box, or corner bounds (0,0), (0,a), (a,b), (0,b).

A Boolean operation is performed between the resultant single loop (shown in FIG. 4) and the Cartesian mesh (shown in FIG. 5). This Boolean operation is an intersection and subtraction operation where part of the Cartesian mesh outside the single loop (502) and intersecting with it is erased/deleted. All quad elements intersecting with the resultant loop within a tolerance or exterior to its domain are deleted.

Figure 6:
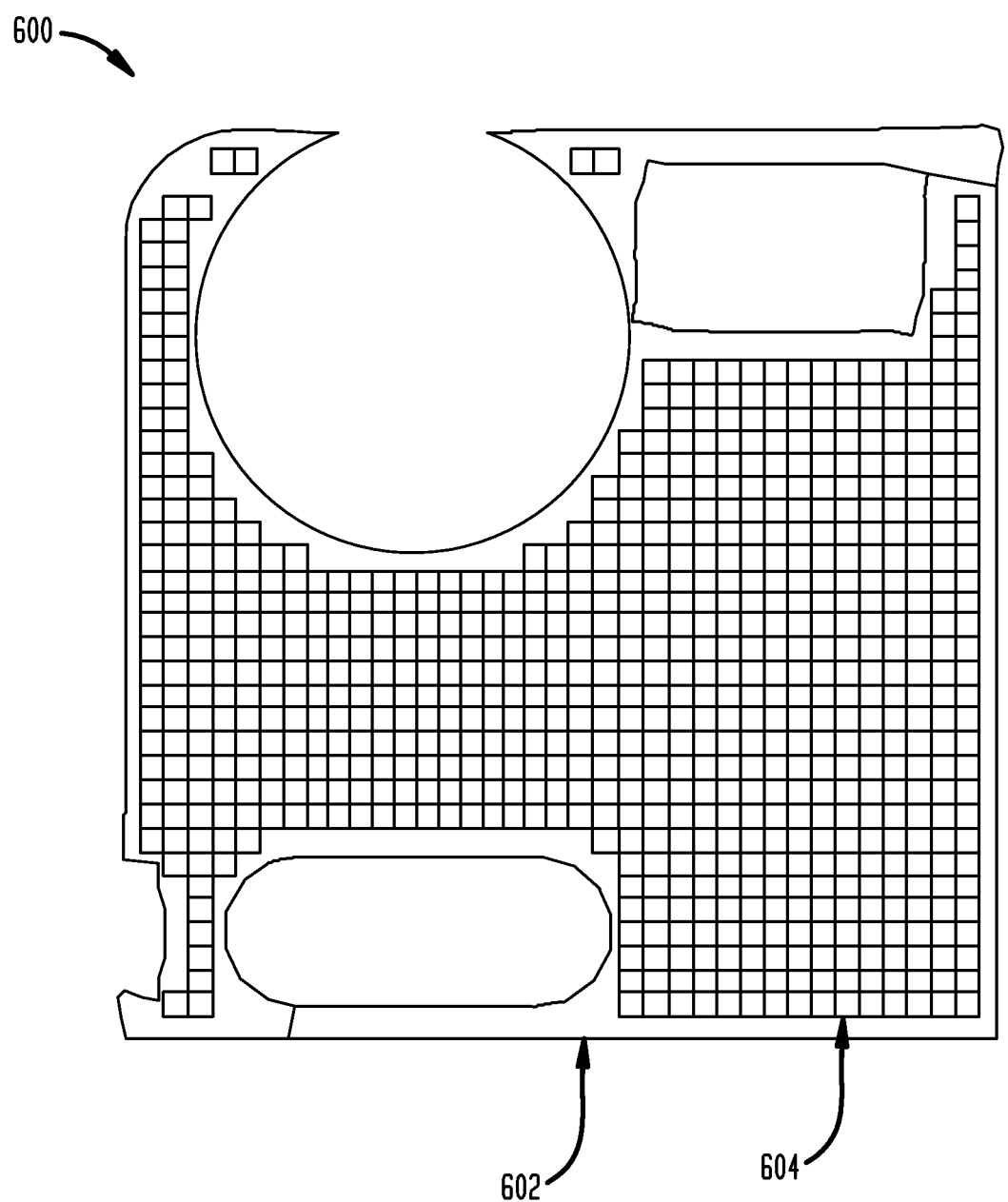
FIG. 6 illustrates an example of the result of a Boolean action to produce a model in accordance with disclosed embodiments.

FIG. 6 illustrates an example of the result of such a Boolean action between the single loop and the Cartesian mesh, as performed on the loop 402 of FIG. 4 Cartesian mesh 504 of FIG. 5 to produce model 600, in accordance with disclosed embodiments. All elements of mesh 604 that intersect with loop 602 and fall outside of it are removed.

Figure 7:
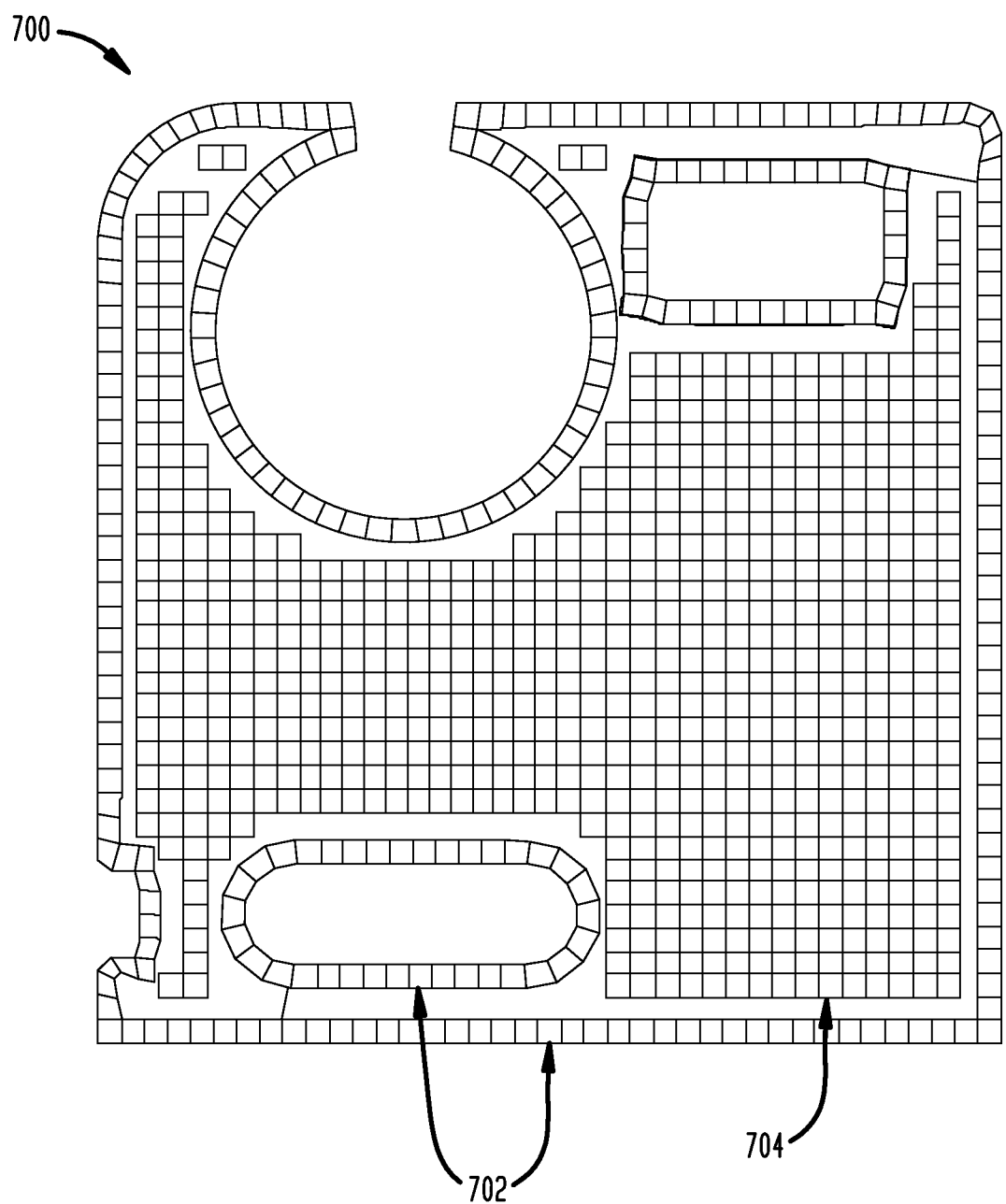
FIG. 7 illustrates an example of a model with a combination of elements from zones one and two in accordance with disclosed embodiments.

FIG. 7 illustrates an example of a model 700 with the combination of the elements in Zone 1 (e.g., elements 702) and Zone 2 (e.g., elements 704) in accordance with disclosed embodiments.

The system then extracts the free element edges of these two disjointed meshes to form two separate node-loops (these may be referred to as zone nodeloops herein).

Figure 8:
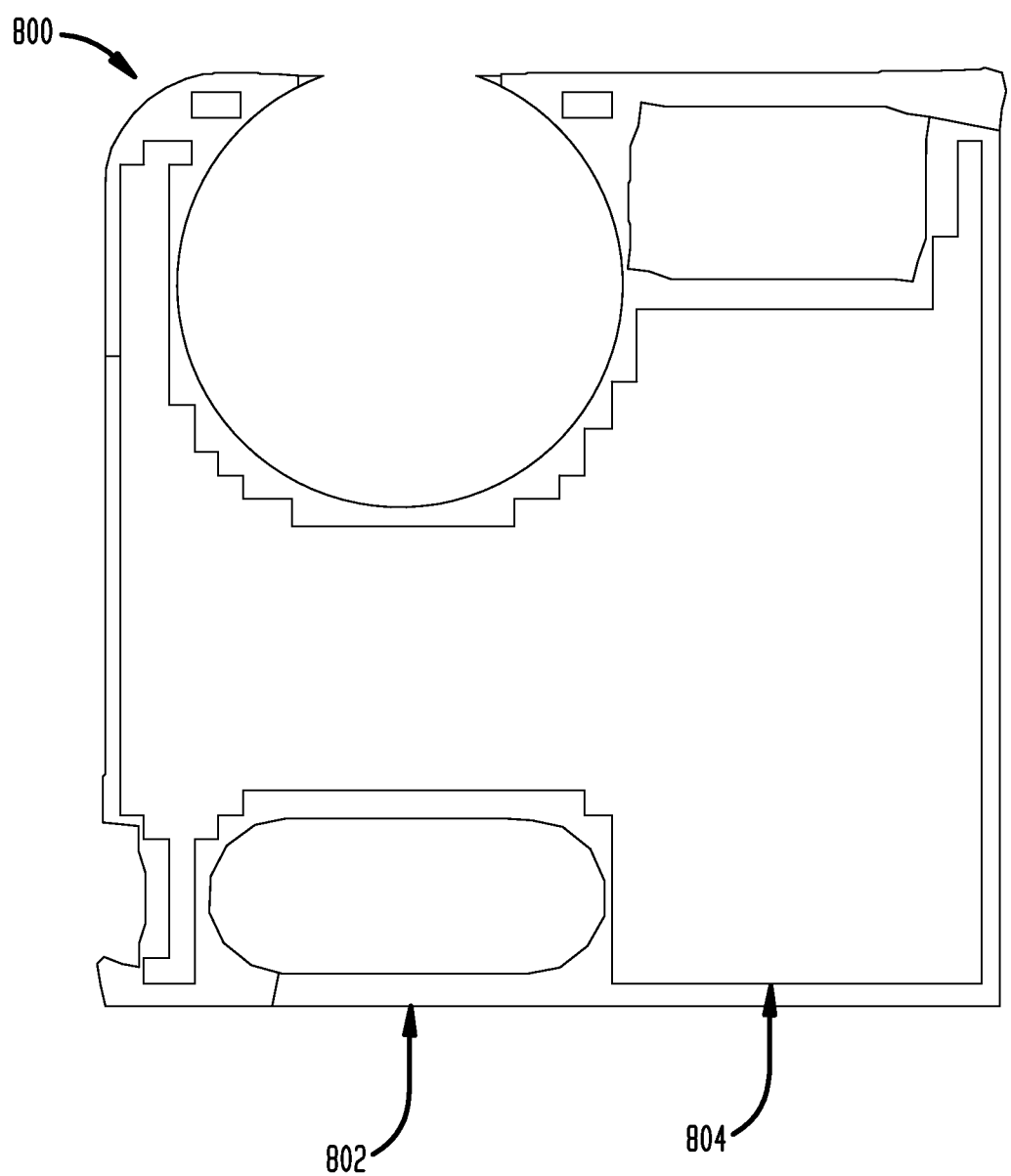
FIG. 8 illustrates node loops in a model in accordance with disclosed embodiments.
Figure 9:
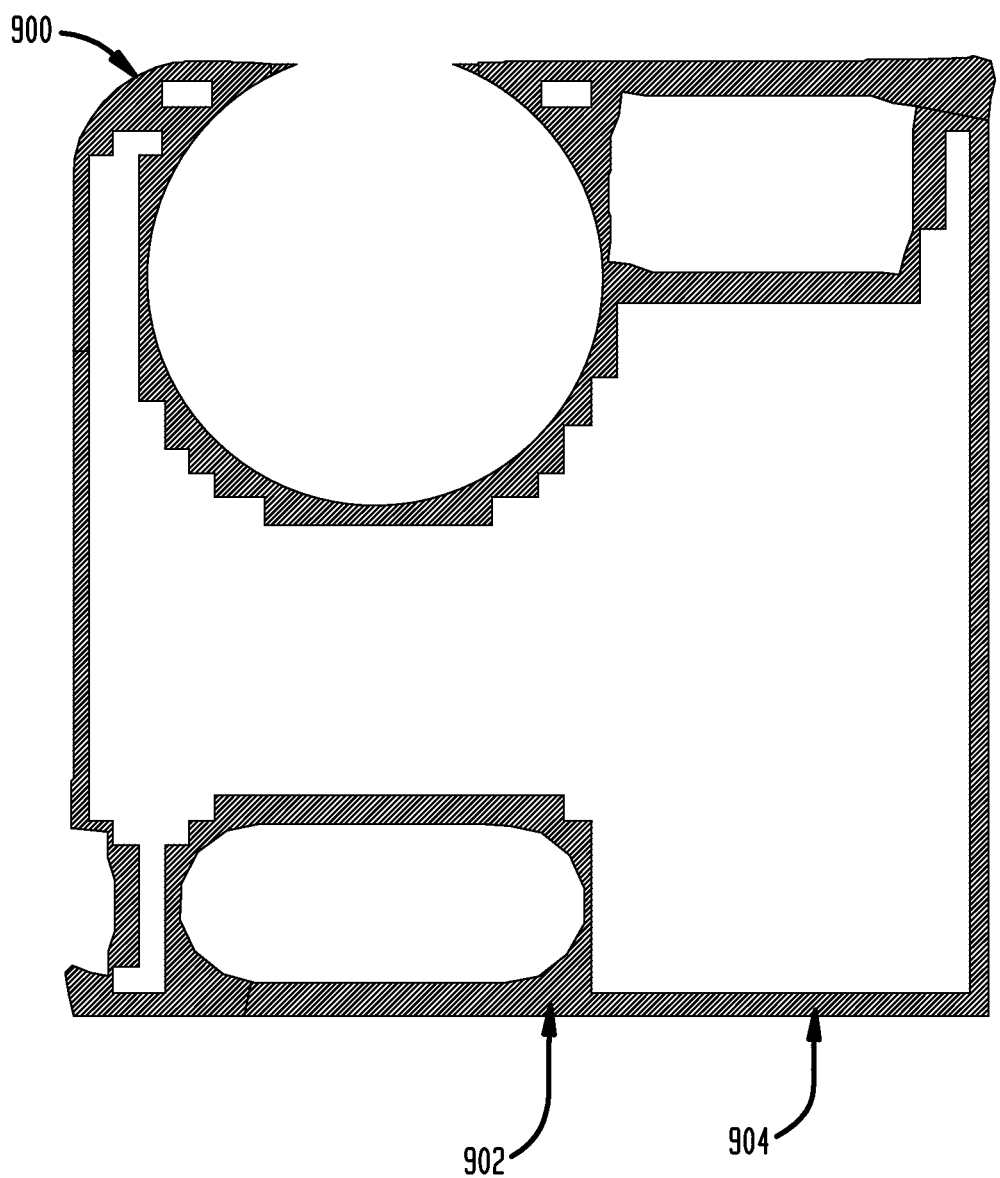
FIG. 9 illustrates a third area formed by joined nodeloops in accordance with disclosed embodiments.

FIG. 8 illustrates zone nodeloops 802 and 804 in model 800 that correspond to the free element edges of the Zone 1 and Zone 2 elements (FIG. 9).

The system then connects the two separate node loops using nodeloop joining process as known to those of skill in the art. Once these nodeloops are joined, a single nodeloop results (the "single zone nodeloop"). This loop forms the area of Zone 3.

FIG. 9 illustrates a third area 902 ("Zone 3") formed by the joined nodeloops (single zone nodeloop 904) in model 900 in accordance with disclosed embodiments. As is evident, Zone 3 represents the slivery void between Zone 1 and Zone 2, which are both areas with very regular, structured meshes with high quality and isotropic quadrangular elements.

The system performs subdivision meshing in Zone 3. This narrow region in Zone 3 is meshed with a subdivision mesher process.

Figure 10:
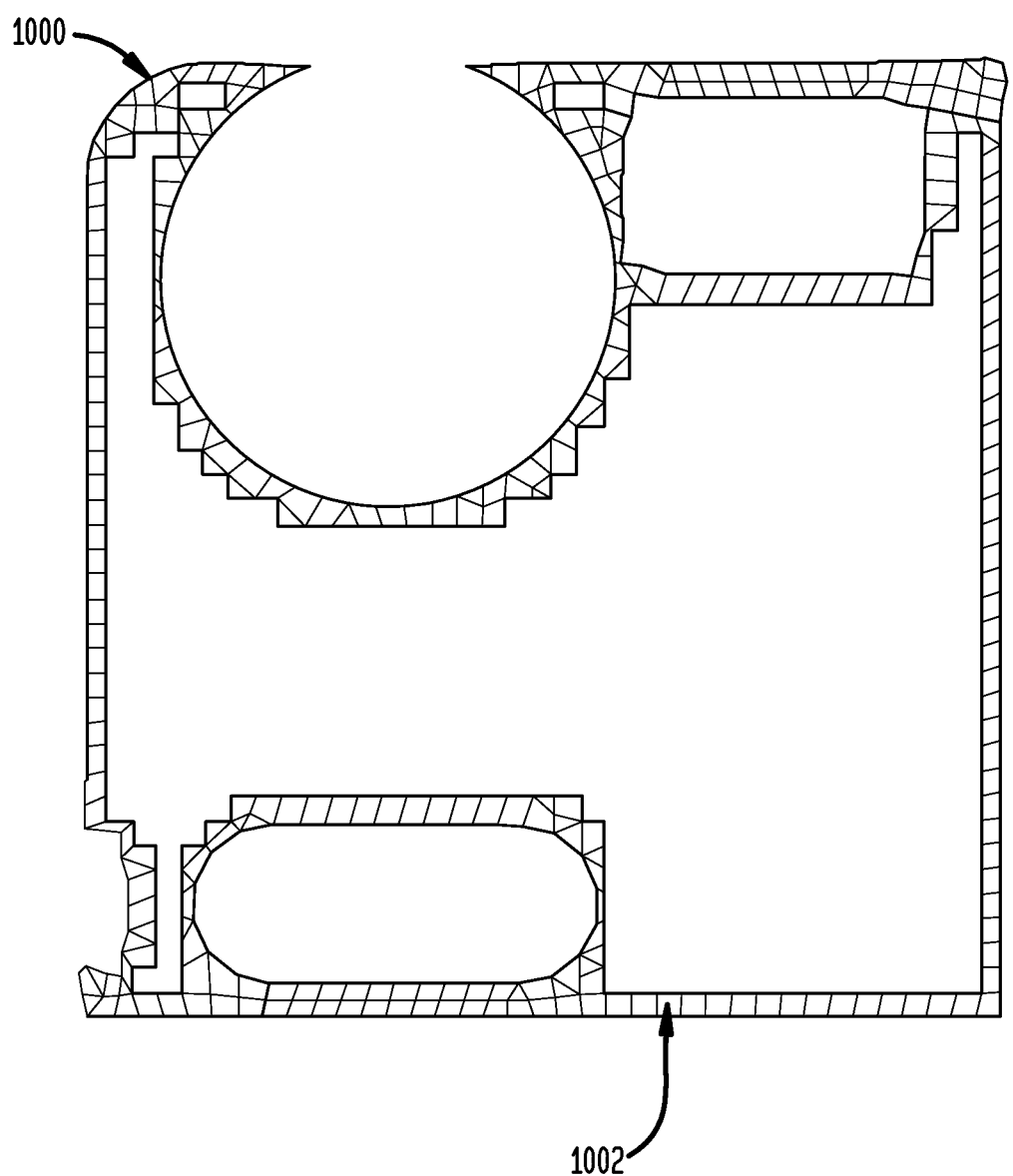
FIG. 10 illustrates a subdivision mesh in a Zone 3 area of a model, in accordance with disclosed embodiments.

FIG. 10 illustrates the subdivision mesh in Zone 3 area 1002 of model 1000, in accordance with disclosed embodiments.

Figure 11:
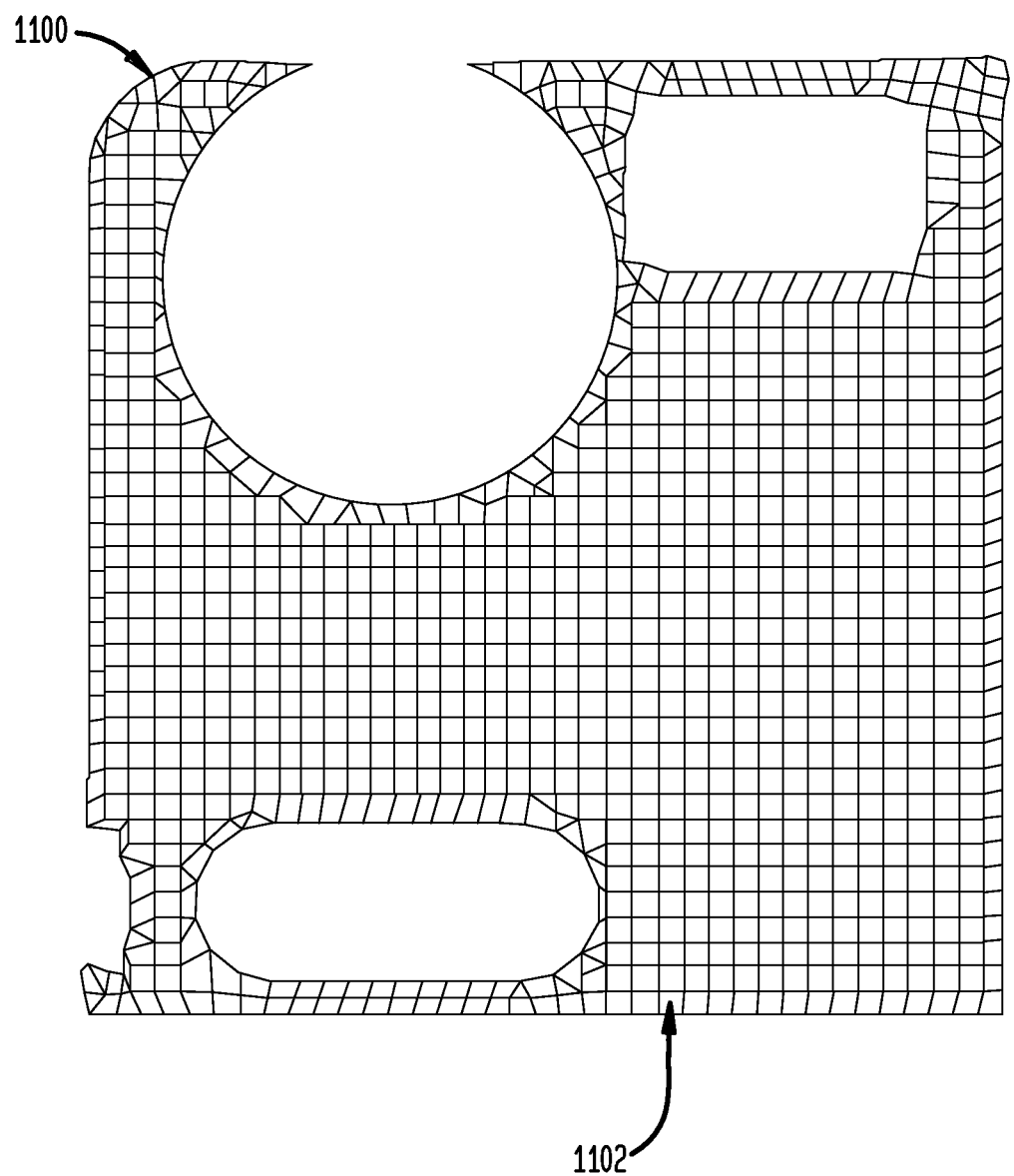
FIG. 11 illustrates a model with a two-combination mesh on zones two and three in accordance with disclosed embodiments.

FIG. 11 illustrates model 1100 with the combination of the meshes in Zone 2 and Zone 3 for a two-combination mesh 1102.

The system can perform a smoothing process on combination mesh 1102 using a smoothing process such as described in U.S. Pat. No. 9,082,220, hereby incorporated by reference.

The system combines the two-combination mesh (Zone 2 and Zone 3) with the mesh in Zone 1 to produce a three-combination mesh. Note that all three zones may be combined at once to produce the three-combination final mesh, or they can be combined in different orders, to produce the three-combination final mesh.

Figure 12:
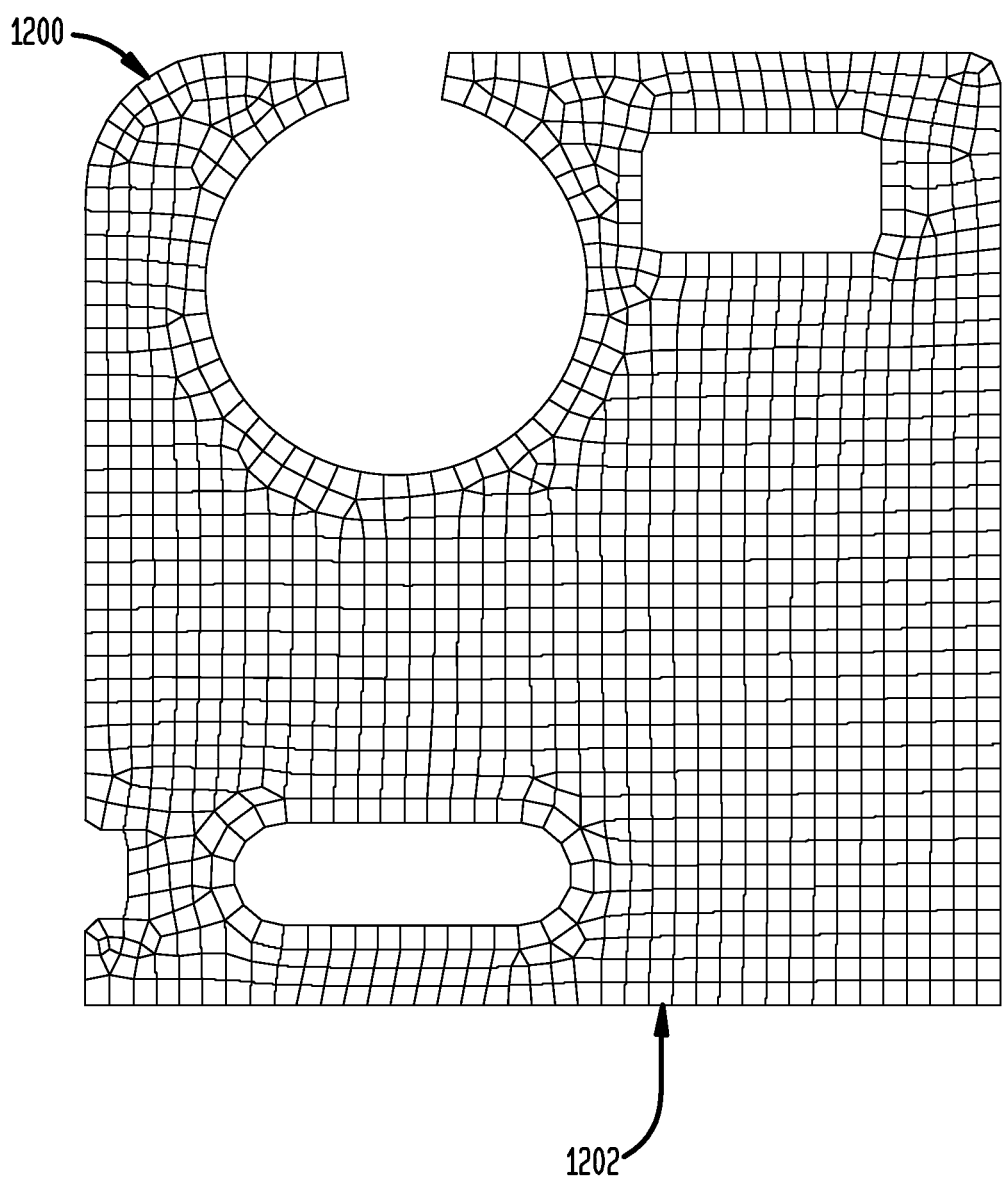
FIG. 12 illustrates a three-combination final mesh in accordance with disclosed embodiments.

FIG. 12 illustrates a three-combination final mesh 1202 in model 1200 as a combination of Zones 1, 2, and 3 in accordance with disclosed embodiments. Compare the three-combination final mesh in FIG. 12 to the multiblocked mesh illustrates in FIG. 2. The sub-areas of the multiblocked face are aggressively mapped-meshed.

If a Subdivision mesher process creates p elements and $q_s$ nodes, the mesh can be expressed as $$S = \cup (p, q_s) \quad (1.4)$$

Even without examining the various specific parameters (such as min/max element size, element angles, warp, taper, skew, Jacobian, aspect ratio, etc.) traditionally used to measure quadrangular element quality, it is evident from plain visual inspection how much more the elements of the Cartesian Paver three-combination mesh in FIG. 12 are high quality, uniform, isotropic, well-angled, minimally skewed and tapered compared to the multiblocked and subarea mapped mesh illustrated in FIG. 2.

The system can also transform the bounding box of the surface of the part (and/or the surface itself). In the example described above, the bounding box of the surface aligns with the global X-Y axes of the 2D domain where meshing is performed. Such an alignment is not always possible.

Figure 13:
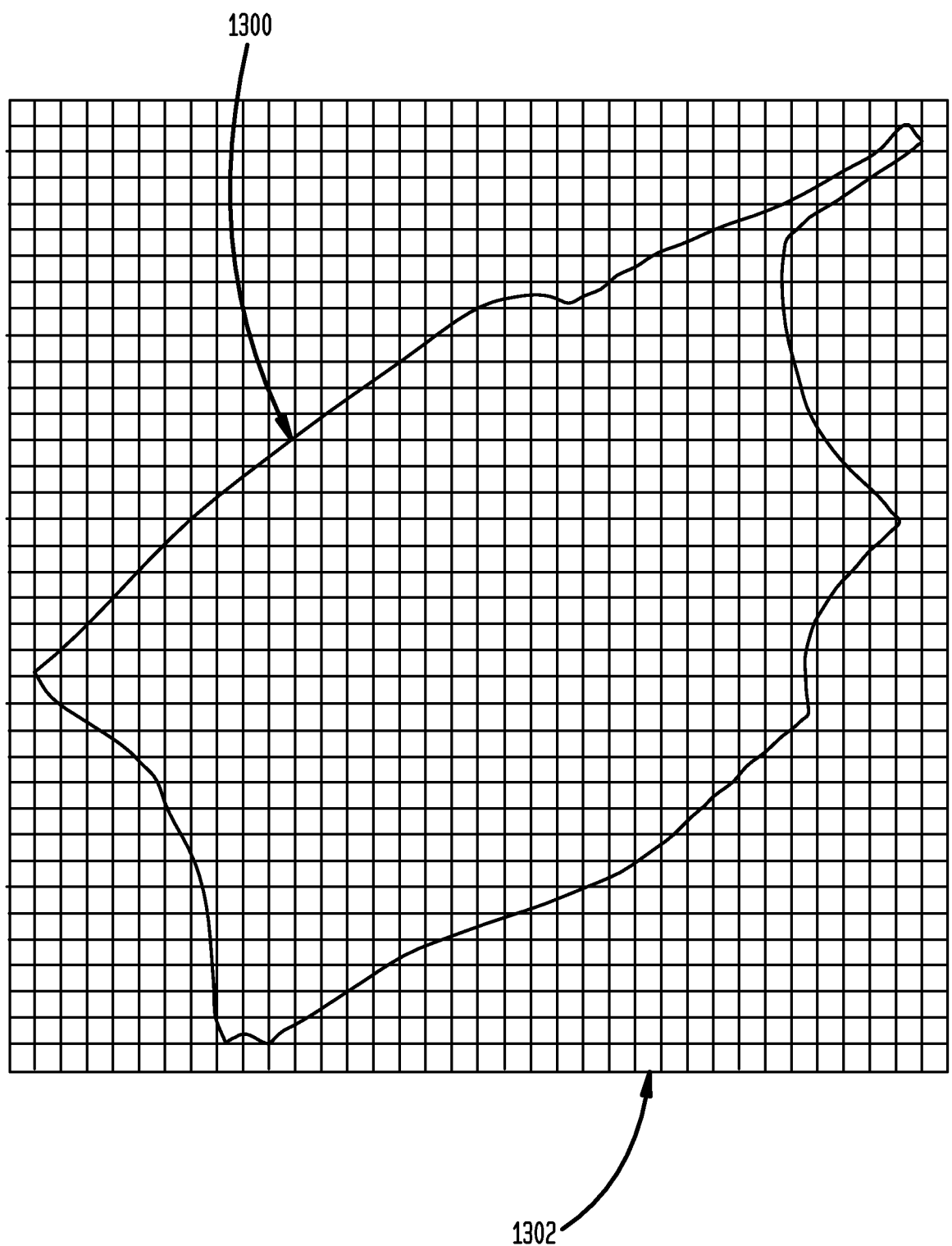
FIG. 13 illustrates an example of a surface with an axis at an angle to the XY plane in accordance with disclosed embodiments.

FIG. 13 illustrates an example of a surface 1300 with an axis at an angle to the XY plane represented by grid 1302. The outer loop of the face to be meshed can be oriented at an angle with the X-Y axes. In such cases, the system can determine the angle between the longest linear stretch of the outer-loop with the X-axis, then determine a transformation matrix based on that angle. The system can use the transformation matrix to transform the node-loops of the face so that they are parallel to the X-Y plane. The Cartesian mesh C is generated in that transformed plane and after mesh truncation as illustrated in FIG. 6, the elements are reverse-transformed to the original plane. FIGS. 13-16 illustrate such a process.

Figure 14:
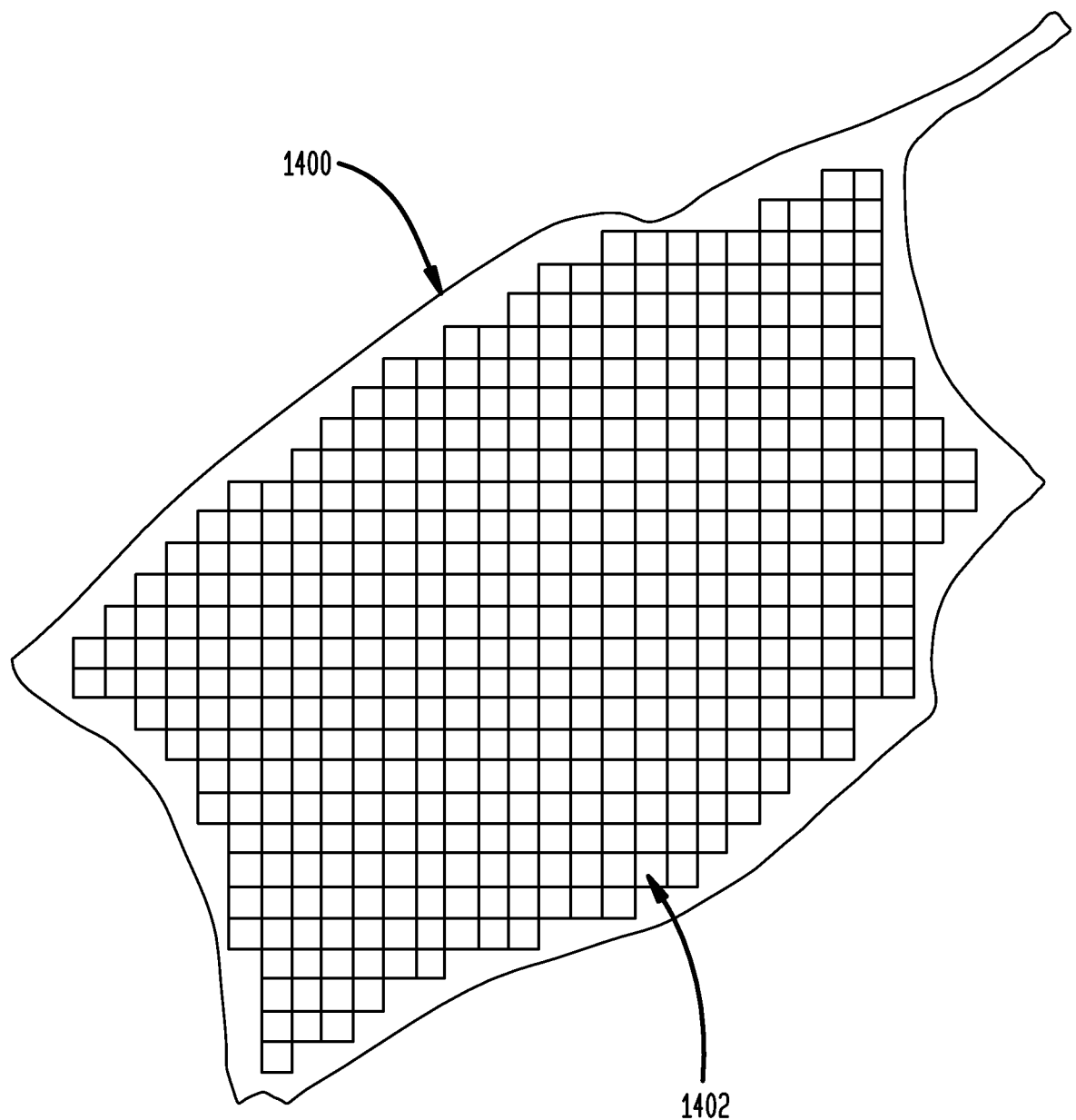
FIG. 14 illustrates a Boolean-ed Cartesian mesh in accordance with disclosed embodiments.

FIG. 14 illustrates a Boolean-ed Cartesian mesh 1402 in accordance with disclosed embodiments, on a surface 1400 as in FIG. 13.

Figure 15:
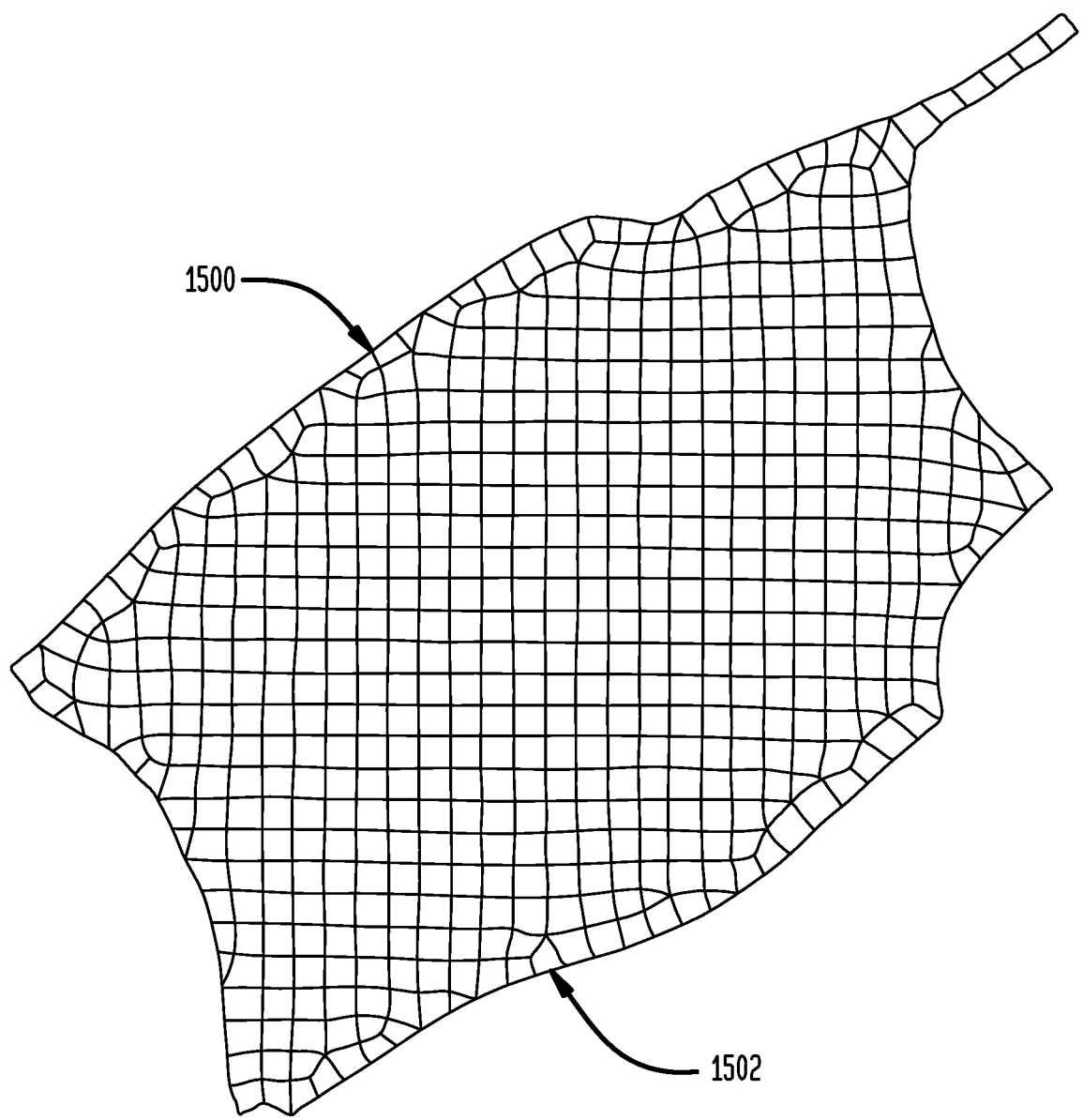
FIG. 15 illustrates a final mesh Cartesian-paver mesh generated on the surface in accordance with disclosed embodiments.

FIG. 15 illustrates the final mesh Cartesian-paver mesh 1502 generated on the surface 1500 in accordance with disclosed embodiments. Here the majority of the quad elements are oriented at an angle with respect to the loop axis.

Figure 16:
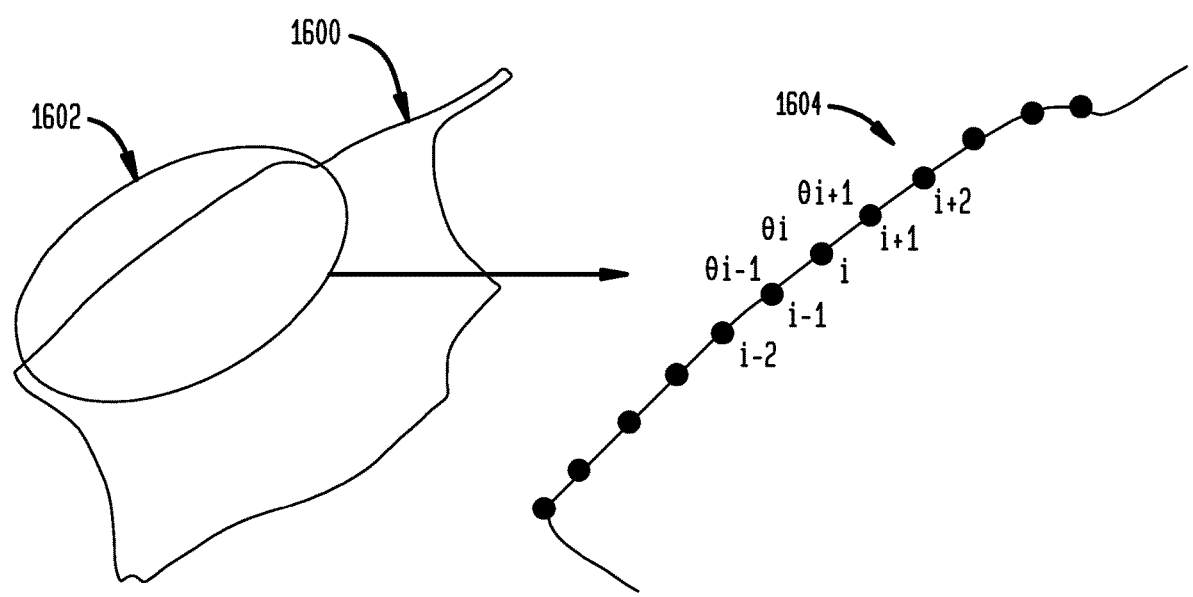
FIG. 16 illustrates a section of the outer loop of the surface that is dominantly linear in accordance with disclosed embodiments.

FIG. 16 illustrates the longest section 1602 of the outer loop of the surface 1600 that is dominantly linear, along with nodeloop details 1604 for section 1602.

Loop-Angle deviation between consecutive nodes on the outer loop of the surface 1600 as illustrated in FIG. 16 is given by $$\varphi_i = (\theta_i - \theta_{i-1}) \quad (1.5)$$

In various embodiments, the loop-angle co, must be less than a limit $\varphi_{lim}$ (in this example, $\varphi_{lim} = 4$ deg.):

$$\varphi_i < \varphi_{lim} \quad (1.6)$$

The collected angle $\sigma_s$ over a loop segment can be expressed as:

$$\sigma_s = \int_{i=s1}^{s2} \sigma_i \, ds \quad (1.7)$$

In various embodiments, the collected angle $\sigma_s$ must be less than a limit (in this example, $\sigma_{lim} = 7$ deg.):

$$\sigma_s \leq \sigma_{lim} \quad (1.8)$$

If conditions are met, the vector $\vec{V}_{s1s2}$ between points s1 & s2 is designated as loop-axis vector. $\vec{V}_{s1s2}$ makes angle $\alpha$ with the global X-axis. If $X_l$ represent position of the nodes in the nodeloop in local coordinates, the position vector in the transformed global coordinate system is given by $$X_g = T \cdot X_l \quad (1.9)$$

where the transformation matrix T is given by $$T = \begin{bmatrix} \cos\alpha & \sin\alpha \\ -\sin\alpha & \cos\alpha \end{bmatrix} \quad (1.10)$$

Note that although the mesh illustrated in FIG. 15 is very high quality, structured, isotropic in the core, the mesh is not oriented along face boundary. To address this issue, the face nodeloop(s) can be transformed using the transform in equation 1.9 above as $$L_{new}(x,y)=[T]L_{orig}(x,y) \quad (1.11)$$

Where $L_{orig}$ designates the original face nodeloop, and $L_{new}$ is the new nodeloop in the transformed plane parallel to one of the global axes.

Figure 17:
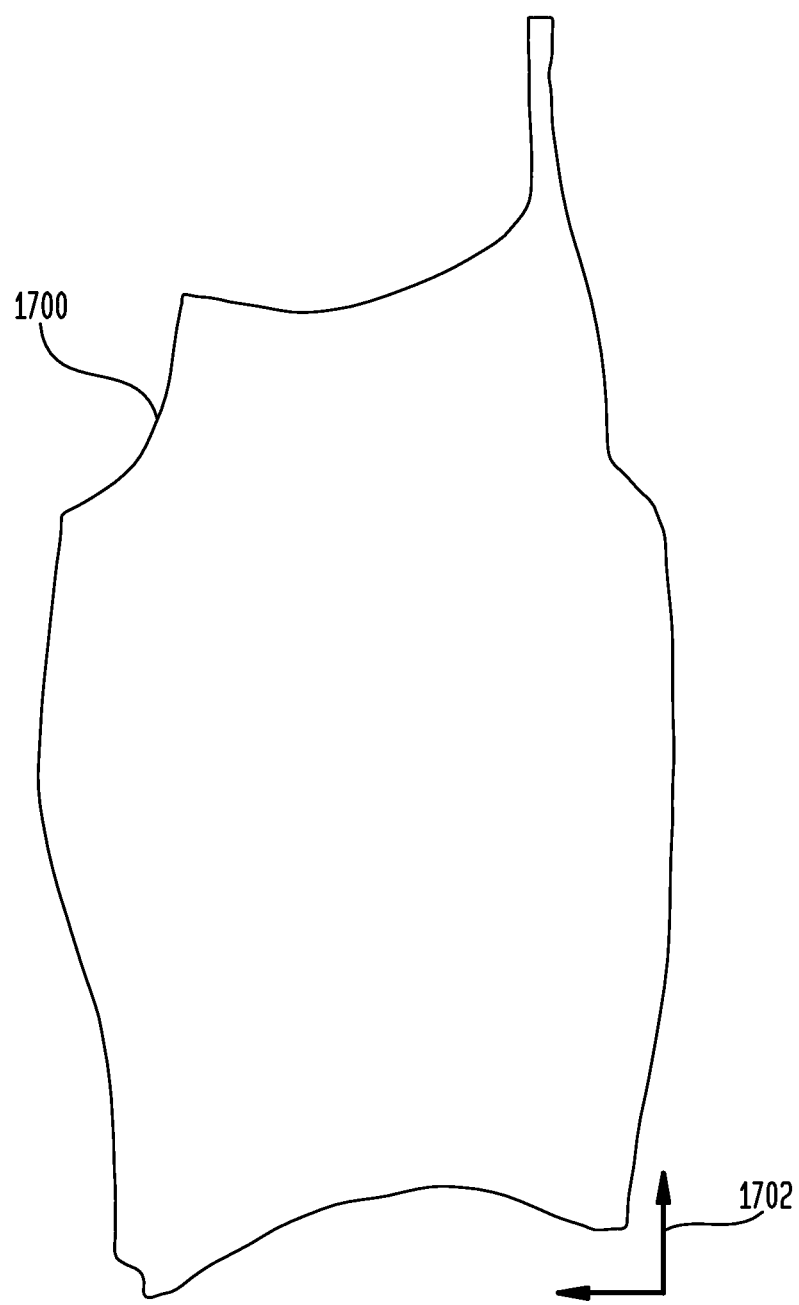
FIG. 17 illustrates an example of a surface with an axis that has been transformed to align to the XY plane, in accordance with disclosed embodiments.
Figure 18:
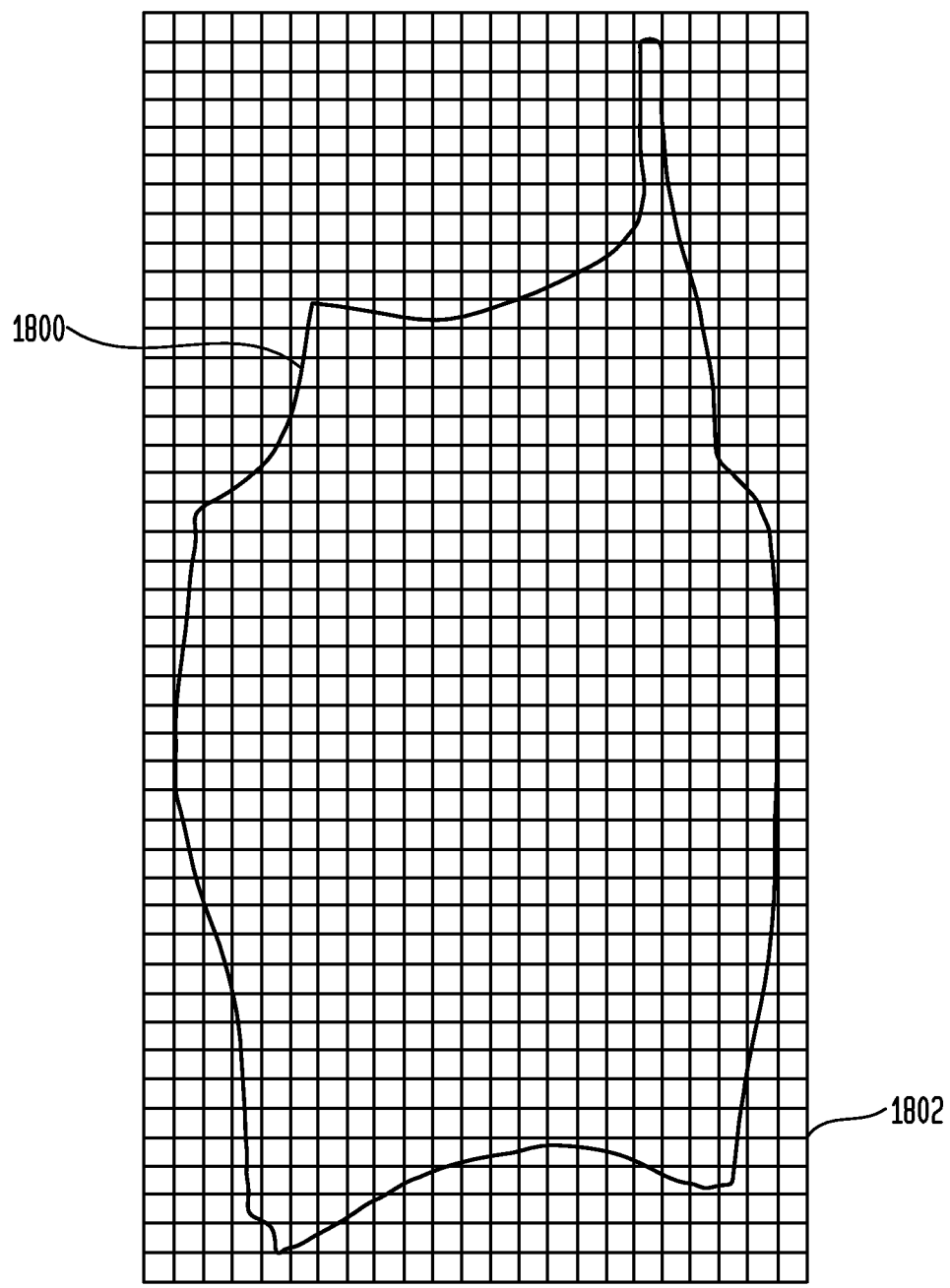
FIG. 18 illustrates an example of a surface mesh with an axis that has been transformed to align to the XY plane, in accordance with disclosed embodiments.

The transformed nodeloop and the resultant Cartesian mesh are shown in FIGS. 17-18.

FIG. 17 illustrates an example of a surface 1700 with an axis that has been translated to align to the XY plane 1702, in accordance with disclosed embodiments. The surface nodeloop(s) are transformed so the loop is parallel to X or Y axis of the meshing 2D domain.

FIG. 18 illustrates an example of a surface 1800 with an axis that has been translated to align to the XY plane in accordance with disclosed embodiments, showing a Cartesian mesh 1802 in the transformed plane.

Truncation of this mesh follows; next it is inverse-transformed back to its original plane and the processes described above are performed to yield a final mesh.

Figure 19:
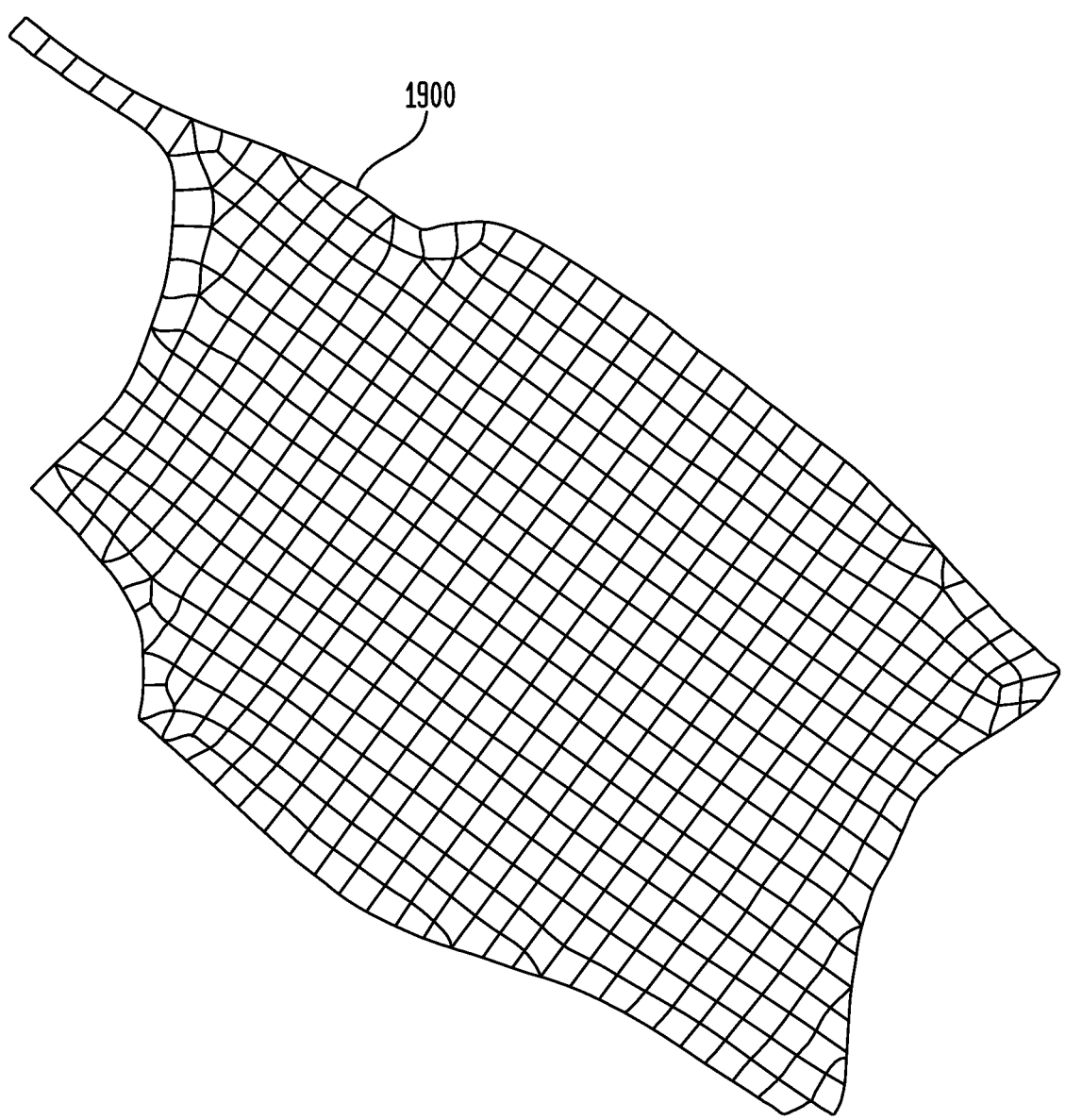
FIG. 19 illustrates an example of a final mesh after inverse transformation of the Cartesian portion in accordance with disclosed embodiments.

FIG. 19 illustrates an example of a final mesh 1900 after inverse transformation of the Cartesian portion. A comparison of FIG. 15 with FIG. 19 reveals the change in the orientation of the final mesh 1900 along the loop-axis direction.

Disclosed embodiments employ a unique hybrid meshing algorithm that provides a substantial improvement in the ability of the CAD system to produce accurate and consistent quad meshes, and to model and manufacture corresponding parts. A mesh generation process as disclosed uses specific meshing techniques in respective "zones" where each is most effective. Disclosed embodiments are an example of a "smart mesher" where the system itself decides how to employ the best meshing method for a given meshing zone and can automatically perform improved, more accurate meshing.

In some embodiments, a transfinite interpolation process is used as part of the subdivision process to improve its efficacy in handling rectangular regions.

In an exemplary implementation for a given model using conventional techniques, 63% of the quadrilateral elements in the final mesh pass an angular deviation of +1-10 degree from the ideal quadrangular shape (90 degree angles). This means the 64% of the quad elements have a worst maximum angle of 100 degree or less and a minimum angle of 80 degree or more. Additionally, in this example, a subdivision multiblock mesher creates 7.2% triangles in the quad-dominant mesh.

For the same model, the multizoned Cartesian-paver meshing process as disclosed produces a mesh where 73% of the quad elements pass a 10 degree variation from the ideal quad shape. Additionally, in this example, the multizoned Cartesian-paver meshing process as disclosed creates only 5.9% triangles.

The multizoned Cartesian-paver meshing process as disclosed is designed to be flexible. It can adjust the employment of the three meshing methods according to the shape of the geometry to be meshed. Each meshing method employed produces a given number of elements for a given user desired global element size. As described above, the paver process produces m elements, the Cartesian mesher process produces n elements and the subdivision process creates p elements. The size of the complete mesh generated by the multizoned Cartesian-paver meshing process as disclosed is given by $$M=\cup(m,n,p) \quad (1.12)$$

The ratio between the elements created by each method is expressed as $$m:n::p=a:b:c \quad (1.13)$$

It's important to understand equation 1.13 is not a constant. The proportions of a, b, and c vary as a function of the shape of the surface meshed. For example, if a surface is rectangular, a=0, b=0, c=1. This means the mesher employs a basic shape recognition feature by means of which it realizes this shape is best meshed by the subdivision process since it has a built-in transfinite or map-mesher and can generate a perfect all-quad mesh on such shapes. In constrast, if a face is wide with a regular boundary, b will have a high proportion, followed by a with c getting reduced to a very small fraction. The multizoned Cartesian-paver meshing process as disclosed is intelligent enough to adjust the intensity of deployment of the three meshing methods depending upon the shape and complexity of the surface.

Many design and analysis processes for manufactured products are performed in batches. Therefore, the users do not want much control, rather they prefer automatic, push-button, batch-driven mesh generation and subsequent finite element analyses. More time is spent in checking mesh quality and in post-processing the analysis results. Analysis time, as well as post-processing results significantly reduces if the quality of the meshes produced are high.

The multizoned Cartesian-paver meshing process as disclosed exploits the strength of three of the most used meshing methods in the industry, and invokes them selectively and intelligently, to generate very high quality, boundary structured, isotropic core meshes with a flimsy unstructured transition zone that satisfies mesh quality requirements.

The multizoned Cartesian-paver meshing process as disclosed is fully automatic and needs no manual intervention and inspection. Few meshing options are required to be set for this mesher. The user can define an element size and the system creates the most isotropic, high quality mesh possible on that surface at the user-desired size.

The multizoned Cartesian-paver meshing process as disclosed improves on other techniques in a number of ways. For example, disclosed processes employ a modification of CSALF-Q only on the surface boundary to generate one or two layers of boundary-structured meshes only (except for regions where the boundary loops self-intersect). Further, the deep interior of the surface is filled with a Cartesian mesh which brings high quadrilateral element quality and isotropy, and the narrow region between the two zones is filled by a subdivision mesher which is a proven and robust meshing process.

Figure 20:
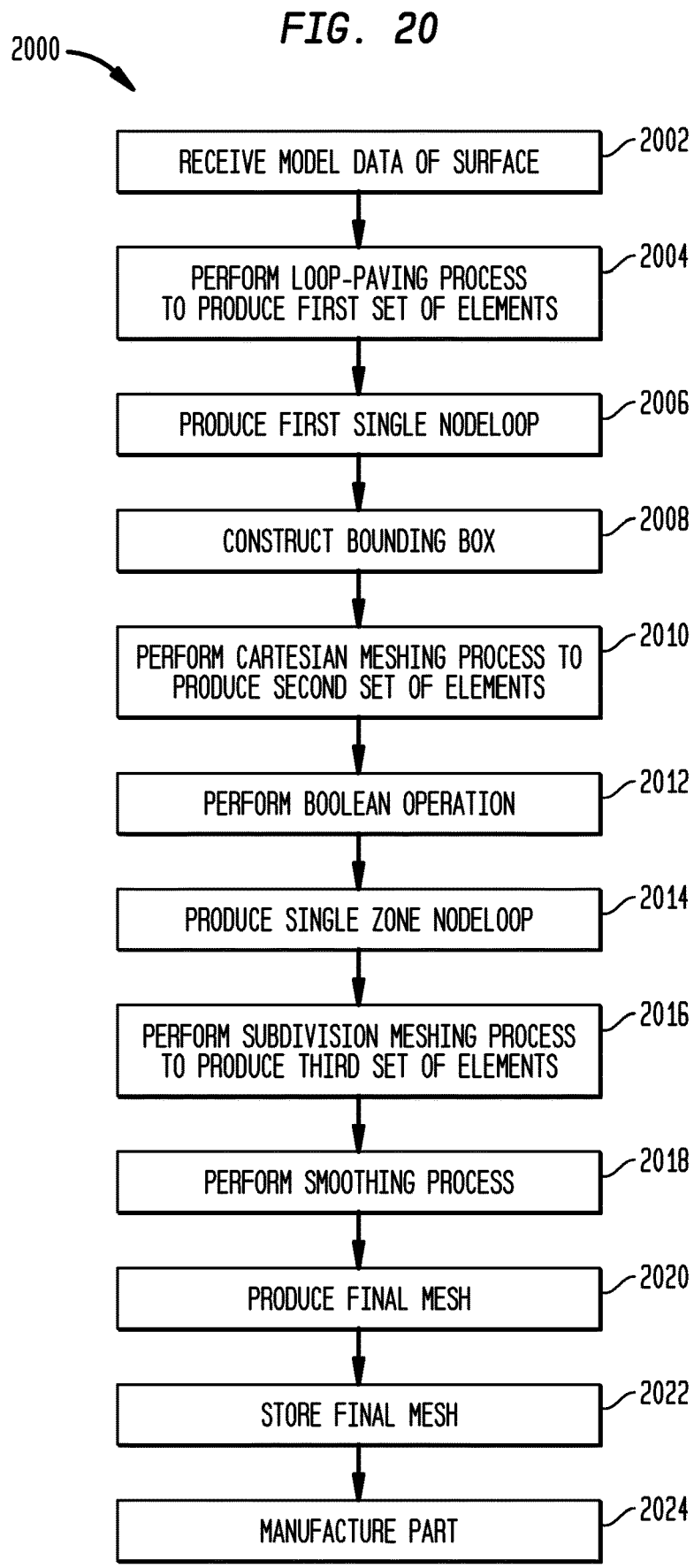
FIG. 20 illustrates a process in accordance with disclosed embodiments.

FIG. 20 illustrates a process 2000 in accordance with disclosed embodiments, that can be performed by a data processing system as disclosed herein, or by another system configured to perform process as described herein, referred to generically below as the "system."

The system receives model data of a surface of a part to be manufactured (2002). The model data can be 2D model data or 3D solid model data. This can include an entire model of the part (including the surface) or can include only a subset of the elements of the model that includes the surface. Receiving, as used herein, can include loading from storage, receiving from another device or process, receiving via an interaction with a user, or otherwise. The surface includes at least one face loop (i.e., the outer boundary loop) and may include other loops (interior loops). These face loops may be referred to as "original loops" of the surface. As part of or subsequent to receiving the model data of the surface of the part to be manufactured, the system can translate or transform a bounding box of the surface to a different 2D or 3D coordinate domain as described herein.

The system performs a loop-paving process for a first portion of the surface to produce a first set of elements (2004). According to various embodiments, the first set of elements bound each original loop of the surface and define a first zone. Note that labels "first," "second," etc., are intended to distinguish various elements, zones, and processes from each other, and do not imply a required order of operations or that any one label requires elements with a different label. The loop-paving process can be a Combined Subdivision And Loop-Front-Quad (CSALF-Q) process. The first set of elements can define a set of second loops. The first set of elements may be in one or two layers. The first set of elements does not include any intersecting elements (that is, if the process produces intersecting elements, those elements can be removed).

The system defines boundary nodeloops for the surface according to the first set of elements and joins the boundary nodeloops to produce a first single nodeloop (2006).

The system constructs a bounding box according to the first single nodeloop (2008).

The system performs a Cartesian meshing process for a second portion of the surface, according to the bounding box, to produce a second set of elements (2010). According to various embodiments, the second set of elements define a second zone.

The system can perform a Boolean operation to remove, from the second set of elements, any of the second set of elements that intersect the first single nodeloop (2012).

The system defines zone nodeloops for the surface according to the first set of elements and the second set of elements, and joins the zone nodeloops to produce a single connected zone nodeloop (2014).

The system performs a subdivision meshing process for a third portion of the surface, according to the single zone nodeloop, to produce a third set of elements (2016). According to various embodiments, the third set of elements define a third zone.

The system can perform a mesh smoothing process on a combination of the second set of elements and the third set of elements (2018).

The system combines the first set of elements, the second set of elements, and the third set of elements to produce a final mesh for the surface of the part to be manufactured (2020). As part of this process, the system can perform an inverse transformation of the transformation process described above.

The system can store the final mesh with the model data of the surface of the part to be manufactured (2022).

In some cases, the system can then manufacture the part according to the final mesh and the model data (2024).

Figure 21:
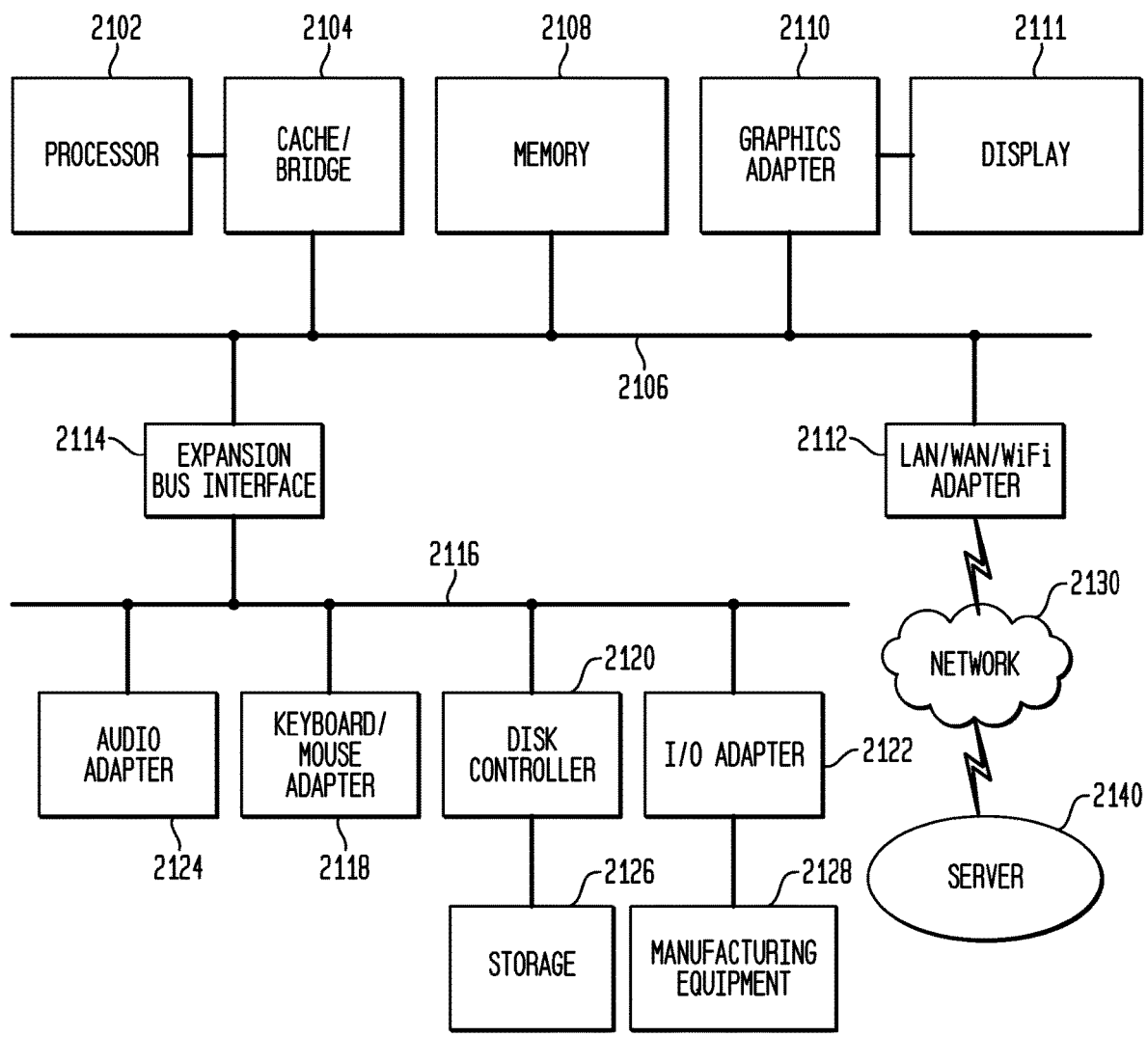
FIG. 21 illustrates a block diagram of a data processing system in which an embodiment can be implemented.

FIG. 21 illustrates a block diagram of a data processing system in which an embodiment can be implemented, for example as a CAD or PDM system particularly configured by software or otherwise to perform the processes as described herein, and in particular as each one of a plurality of interconnected and communicating systems as described herein. The data processing system depicted includes a processor 2102 connected to a level two cache/bridge 2104, which is connected in turn to a local system bus 2106. Local system bus 2106 may be, for example, a peripheral component interconnect (PCI) architecture bus. Also connected to local system bus in the depicted example are a main memory 2108 and a graphics adapter 2110. The graphics adapter 2110 may be connected to display 2111.

Other peripherals, such as local area network (LAN)/Wide Area Network/Wireless (e.g. Wi-Fi) adapter 2112, may also be connected to local system bus 2106. Expansion bus interface 2114 connects local system bus 2106 to input/output (I/O) bus 2116. I/O bus 2116 is connected to keyboard/mouse adapter 2118, disk controller 2120, and I/O adapter 2122. Disk controller 2120 can be connected to a storage 2126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 2116 in the example shown is audio adapter 2124, to which speakers (not shown) may be connected for playing sounds. Keyboard/mouse adapter 2118 provides a connection for a pointing device (not shown), such as a mouse, trackball, track pointer, touchscreen, etc. I/O bus 2116 can also be connected to manufacturing equipment 2128 either direct or via I/O adapter 2122 for manufacturing parts according to the processes disclosed herein.

Those of ordinary skill in the art will appreciate that the hardware depicted in FIG. 21 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 2112 can be connected to a network 2130 (not a part of data processing system 2100), which can be any public or private data processing system network or combination of networks, as known to those of skill in the art, including the Internet. Data processing system 2100 can communicate over network 2130 with server system 2140, which is also not part of data processing system 2100, but can be implemented, for example, as a separate data processing system 2100.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 2100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Various publications describe techniques related to those disclosed herein, including the following, each of which is hereby incorporated by reference:

O. C. Zienkiewicz and D. V. Phillips, *An automatic mesh generation scheme for plane and curved surfaces by 'isoparametric' co-ordinates*, Int. Journal Num. Meth. Engg., Vol. 3, (4), pp. 519-528, (1971).

M. L. Sluiter and D. L. Hansen. 1982. *A general purpose automatic mesh generator for shell and solid finite elements*, ASME Computers in Engg., 29-34.

N. P. Yerry, and M. S. Shephard, *A modified quadtree approach to finite element mesh generation*. IEEE Comp. Graps and Appls. 3(1), pp. 39-46, (1983).

T. Blacker and M. Stephenson, Paving: *A new approach to automated quadrilateral mesh generation*, Int. Journal Num. Meth. Engg., Vol. 32, pp. 811-847, (1991).

R. Schneiders, *Automatic generation of hexahedral finite element meshes*, Proc. 4th Int. Meshing Roundtable, Albuquerque, N. Mex., pp. 130-114 (October, 1995).

M. Bern, D. Eppstein, *Quadrilateral Meshing by Circle Packing*, Int. J. Comput. Geom. Appl. Vol 10, p. 347-360, (2000).

S. J. Owen, M. L. Staten, S. A. Canann and S. Saigal, Q-MORPH: *An Indirect approach to Advancing Front Quad Meshing*, Int. J. Numer. Meth. Engng. 44, pp. 1317-1340, (1999).

J. Makem and N. Mukherjee, Mesh generation system and method, patent application, WO2017040006A1, Mar. 9, 2017.

N. Mukherjee, CSALF-Q: *A Bricolage Algorithm for Anisotropic Quad Mesh Generation*, Proc. XXth International Meshing Roundtable, Paris, France, pp. 489-510, Springer, 2011.

J. Cabello, *Toward Quality Surface Meshing*, Proc. XIIth International Meshing Roundtable, Santa Fe, N. Mex., pp. 201-213, (2003).

N. Mukherjee, *System, method, and computer program product for smoothing*, patent, U.S. Pat. No. 9,082,220 B2, Jul. 14, 2015.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. A method comprising:
by a computing system:
receiving model data of a surface of a part to be manufactured;
performing a loop-paving process for a first zone of the surface to produce a first set of mesh elements;
determining a second zone of the surface based on an intersection of the first zone and a Cartesian mesh for the surface;
performing a Cartesian meshing process for the second zone of the surface to produce a second set of mesh elements;
determining a third zone of the surface through node-loops based on mesh element edges of the first set of mesh elements produced for the first zone of the surface and the second set of mesh elements produced for the second zone of the surface;
performing a subdivision meshing process for the third zone of the surface to produce a third set of mesh elements; and
combining the first set of mesh elements, the second set of mesh elements, and the third set of mesh elements to produce a final mesh for the surface of the part to be manufactured.

2. The method of claim 1, further comprising determining the first zone of the surface as a single layer of paver mesh elements that surround face boundaries of the surface.

3. The method of claim 1, further comprising determining the first zone of the surface to include layer of paver mesh elements that surround face boundaries of the surface, including by discarding any intersecting paver mesh elements in the layer that surround the face boundaries but keeping paver mesh elements in the layer that do not intersect with other paver mesh elements.

4. The method of claim 1, wherein determining the second zone of the surface comprises:
performing an intersection between the first zone of the surface and the Cartesian mesh for the surface;
discarding Cartesian mesh elements that are outside of the first zone and that intersect with the first zone; and
determining the second zone as the remaining Cartersian mesh elements after the discarding.

5. The method of claim 1, further comprising configuring a number of Cartesian mesh elements in the Cartesian mesh according to a user-drive size at which to mesh the surface.

6. The method of claim 1, wherein determining the third zone of the surface comprises:

determining a first nodeloop through free mesh element edges of the first set of mesh elements;
determining a second nodeloop through free mesh element edges of the second set of mesh elements; and
combining the first nodeloop and the second nodeloop to form the third zone of the surface.

7. The method of claim 1, further comprising, prior to performing the Cartesian meshing process for the second zone of the surface, translating the surface such that a longest section of an outer loop of the surface is aligned with an axis of the Cartersian mesh.

8. A non-transitory computer-readable medium comprising instructions that, when executed by a processor, cause a computing system to:
receive model data of a surface of a part to be manufactured;
perform a loop-paving process for a first zone of the surface to produce a first set of mesh elements;
determine a second zone of the surface based on an intersection of the first zone and a Cartesian mesh for the surface;
perform a Cartesian meshing process for the second zone of the surface to produce a second set of mesh elements;
determine a third zone of the surface through nodeloops based on mesh element edges of the first set of mesh elements produced for the first zone of the surface and the second set of mesh elements produced for the second zone of the surface;
perform a subdivision meshing process for the third zone of the surface to produce a third set of mesh elements; and
combine the first set of mesh elements, the second set of mesh elements, and the third set of mesh elements to produce a final mesh for the surface of the part to be manufactured.

9. The non-transitory computer-readable medium of claim 8, wherein the instructions, when executed, further cause the computing system to determine the first zone of the surface as a single layer of paver mesh elements that surround face boundaries of the surface.

10. The non-transitory computer-readable medium of claim 8, wherein the instructions, when executed, further cause the computing system to determine the first zone of the surface to include layer of paver mesh elements that surround face boundaries of the surface, including by discarding any intersecting paver mesh elements in the layer that surround the face boundaries but keeping paver mesh elements in the layer that do not intersect with other paver mesh elements.

11. The non-transitory computer-readable medium of claim 8, wherein the instructions, when executed, cause the computing system to determine the second zone of the surface by:
performing an intersection between the first zone of the surface and the Cartesian mesh for the surface;
discarding Cartesian mesh elements that are outside of the first zone and that intersect with the first zone; and
determining the second zone as the remaining Cartersian mesh elements after the discarding.

12. The non-transitory computer-readable medium of claim 8, wherein the instructions, when executed, further cause the computing system to configure a number of Cartesian mesh elements in the Cartesian mesh according to a user-drive size at which to mesh the surface.

13. The non-transitory computer-readable medium of claim 8, wherein the instructions, when executed, further cause the computing system to determine the third zone of the surface by:
determining a first nodeloop through free mesh element edges of the first set of mesh elements;
determining a second nodeloop through free mesh element edges of the second set of mesh elements; and
combining the first nodeloop and the second nodeloop to form the third zone of the surface.

14. The non-transitory computer-readable medium of claim 8, wherein the instructions, when executed, further cause the computing system to, prior to performing the Cartesian meshing process for the second zone of the surface, translate the surface such that a longest section of an outer loop of the surface is aligned with an axis of the Cartersian mesh.

15. A system comprising:
a processor; and
a non-transitory computer-readable medium comprising instructions that, when executed by a processor, cause a computing system to:
receive model data of a surface of a part to be manufactured;
perform a loop-paving process for a first zone of the surface to produce a first set of mesh elements;
determine a second zone of the surface based on an intersection of the first zone and a Cartesian mesh for the surface;
perform a Cartesian meshing process for the second zone of the surface to produce a second set of mesh elements;
determine a third zone of the surface through nodeloops based on mesh element edges of the first set of mesh elements produced for the first zone of the surface and the second set of mesh elements produced for the second zone of the surface;
perform a subdivision meshing process for the third zone of the surface to produce a third set of mesh elements; and
combine the first set of mesh elements, the second set of mesh elements, and the third set of mesh elements to produce a final mesh for the surface of the part to be manufactured.

16. The system of claim 15, wherein the instructions, when executed, further cause the computing system to determine the first zone of the surface as a single layer of paver mesh elements that surround face boundaries of the surface.

17. The system of claim 15, wherein the instructions, when executed, further cause the computing system to determine the first zone of the surface to include layer of paver mesh elements that surround face boundaries of the surface, including by discarding any intersecting paver mesh elements in the layer that surround the face boundaries but keeping paver mesh elements in the layer that do not intersect with other paver mesh elements.

18. The system of claim 15, wherein the instructions, when executed, cause the computing system to determine the second zone of the surface by:
performing an intersection between the first zone of the surface and the Cartesian mesh for the surface;
discarding Cartesian mesh elements that are outside of the first zone and that intersect with the first zone; and
determining the second zone as the remaining Cartersian mesh elements after the discarding.

19. The system of claim 15, wherein the instructions, when executed, further cause the computing system to configure a number of Cartesian mesh elements in the Cartesian mesh according to a user-drive size at which to mesh the surface.

20. The system of claim 15, wherein the instructions, when executed, further cause the computing system to determine the third zone of the surface by:
- determining a first nodeloop through free mesh element edges of the first set of mesh elements;
- determining a second nodeloop through free mesh element edges of the second set of mesh elements; and
- combining the first nodeloop and the second nodeloop to form the third zone of the surface.

* * * * *